(12) United States Patent
Kabe et al.

(10) Patent No.: US 10,815,568 B2
(45) Date of Patent: Oct. 27, 2020

(54) GAS DISTRIBUTION DEVICE AND PROCESSING APPARATUS

(71) Applicant: TOKYO ELECTRON LIMITED, Tokyo (JP)

(72) Inventors: Takumi Kabe, Nirasaki (JP); Michitaka Aita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 134 days.

(21) Appl. No.: 16/243,007

(22) Filed: Jan. 8, 2019

(65) Prior Publication Data

US 2019/0256976 A1 Aug. 22, 2019

(30) Foreign Application Priority Data

Feb. 19, 2018 (JP) .................. 2018-026926

(51) Int. Cl.
*C23C 16/455* (2006.01)
(52) U.S. Cl.
CPC .............. *C23C 16/45559* (2013.01)
(58) Field of Classification Search
CPC ......... C23C 16/45559; C23C 16/45561; H01J 37/32449; H01J 2237/332; H01J 2237/334
USPC ........................ 118/719; 156/345.31, 345.32
See application file for complete search history.

(56) References Cited

U.S. PATENT DOCUMENTS

| 5,281,295 | A  | * | 1/1994  | Maeda ................ C23C 16/44 118/719 |
| 6,273,956 | B1 | * | 8/2001  | Cox ................ H01L 21/67253 118/719 |
| 6,630,053 | B2 | * | 10/2003 | Yamagishi ........ H01L 21/67173 118/719 |
| 10,428,426 | B2 | * | 10/2019 | Raj .................. C23C 16/4408 |
| 2017/0335450 | A1 | * | 11/2017 | Collins ............ C23C 16/45561 |
| 2017/0342562 | A1 | * | 11/2017 | Lind ................ H01L 21/67017 |

FOREIGN PATENT DOCUMENTS

JP   2009-277730 A    11/2009
KR   10-2011-0032681 A   3/2011

* cited by examiner

*Primary Examiner* — Rudy Zervigon
(74) *Attorney, Agent, or Firm* — Fenwick & West LLP

(57) ABSTRACT

A gas distribution device includes a plurality of supply lines, a branch unit and a variation suppression unit. The supply lines are respectively connected to a plurality of processing chambers. The branch unit is configured to distribute a gas supplied from a gas supply source to the supply lines. The variation suppression unit is provided between the branch unit and the gas supply source and configured to supply the gas from the gas supply source to the branch unit and suppress variation in flow rates of the gas distributed by the branch unit between the supply lines.

9 Claims, 21 Drawing Sheets

GAS DISTRIBUTION DEVICE AND PROCESSING APPARATUS

CROSS-REFERENCE TO RELATED APPLICATION

This application claims priority to Japanese Patent Application No. 2018-026926 filed on Feb. 19, 2018, the entire contents of which are incorporated herein by reference.

FIELD OF THE INVENTION

The present disclosure relates to a gas distribution device and a processing apparatus.

BACKGROUND OF THE INVENTION

Gas distribution in a processing chamber for performing etching, film formation or the like affects characteristics of a processed object. Therefore, it is required to uniformly supply gas into the chamber. However, it is difficult to uniformly supply a gas from a supply line having a small cross sectional area into a space in the processing chamber which has a large cross sectional area.

Therefore, there is known a technique for uniformly distributing a gas into a plurality of supply lines by repeating a process of distributing the gas supplied from the supply line having a small cross sectional area into two supply lines (see, e.g., Japanese Patent Application Publication No. 2009-277730). By supplying a gas into the space in the processing chamber through a plurality of supply lines, it is possible to uniformly supply the gas into the space in the processing chamber.

A plurality of processing chambers may operate simultaneously in order to improve a throughput of processing on a target object. In that case, it is required to reduce a difference in the characteristics of the processing on the target object between the processing chambers. If there is a difference in flow rates of gases supplied into the processing chambers, the characteristics of the processing on the target object between the processing chambers may be different. Therefore, it is preferable to supply the same amount of gas into each of the processing chambers.

For example, by repeating a process of distributing a processing gas into two gas supply lines n times, it is possible to reduce a difference in the flow rates of gases supplied to $2^n$-number of processing chambers. However, this requires lines for repeating the process of distributing the processing gas into two gas supply lines n times and a space for installing the lines. Therefore, the apparatus is scaled-up. If the line through which the processing gas flows becomes long, the volume of the space in the line is increased and, thus, a time for switching processing gases is increased. Accordingly, in the case of performing the processing such as etching, film formation or the like while switching a plurality of gases, the throughput of the processing is decreased.

SUMMARY OF THE INVENTION

In accordance with an aspect, there is provided a gas distribution device including a plurality of first supply lines, a branch unit, a second supply line and a variation suppression unit. The first supply lines are respectively connected to a plurality of processing chambers. The branch unit is configured to distribute a first gas supplied from a first gas supply source and supply the distributed first gas to the processing chambers through the respective first supply lines. The variation suppression unit is provided between the branch unit and the first gas supply source and configured to supply the first gas from the first gas supply source to the branch unit and suppress variation in flow rates of the first gas distributed by the branch unit between the first supply lines.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Hereinafter, embodiments of the gas distribution device and the processing apparatus of the present disclosure will be described in detail with reference to the accompanying drawings. The following embodiments are not intended to limit the gas distribution device and the processing apparatus of the present disclosure.

Configuration of Processing Apparatus 10

Figure 1:
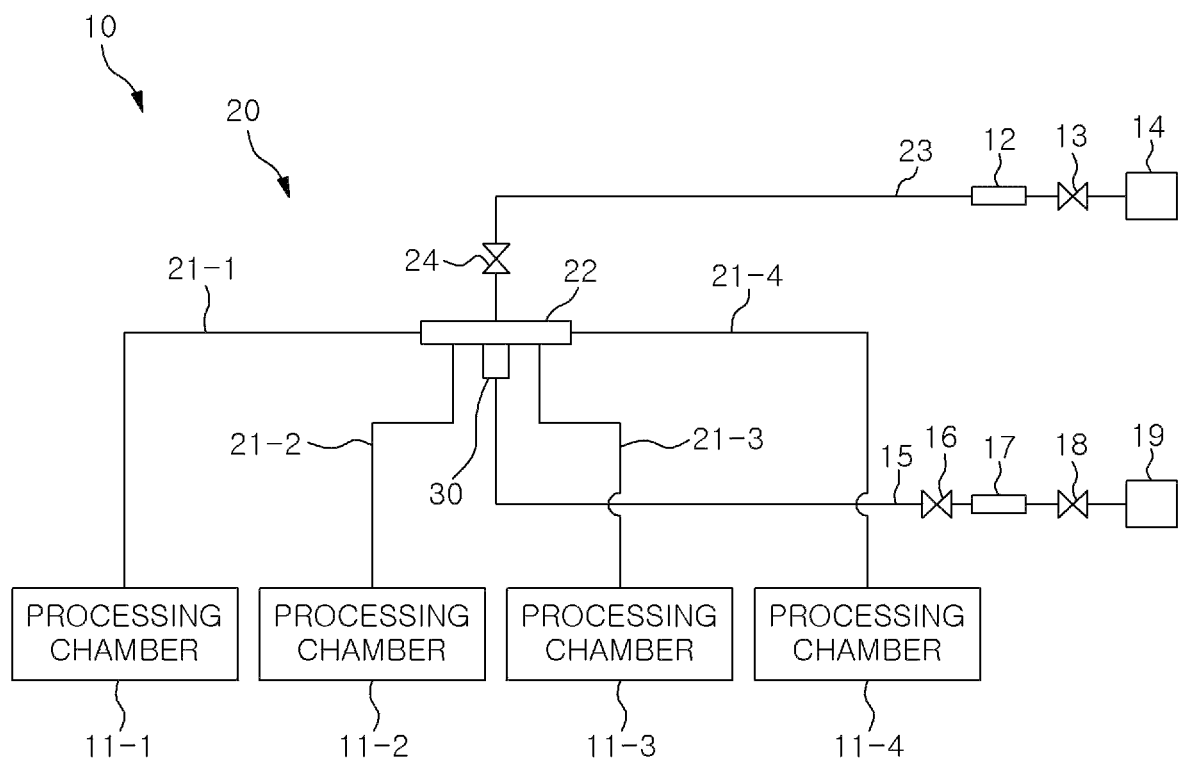
FIG. 1 is a system configuration diagram showing an example of a processing apparatus according to an embodiment.

FIG. 1 is a system configuration diagram showing an example of a processing apparatus 10 according to an embodiment. The processing apparatus 10 includes a plurality of processing chambers 11-1 to 11-4 and a gas distribution device 20. The gas distribution device 20 includes a plurality of supply lines 21-1 to 21-4, a branch unit 22, a line 15, a line 23, a valve 24, and a buffer unit 30. In the following description, the processing chambers 11-1 to 11-4 are collectively referred to as "processing chamber 11," and the supply lines 21-1 to 21-4 are collectively referred to as "supply line 21." The processing apparatus 10 shown in FIG. 1 includes four processing chambers 11. However, the number of the processing chambers 11 may be three or less, or may be five or more. In any case, the number of the supply lines 21 of the processing apparatus 10 is equal to the number of the processing chambers 11. The supply lines 21 are an example of a first supply line, and the line 23 is an example of a second supply line.

A first end of the line 23 is connected to the branch unit 22 via a valve 24. A second end of the line 23 is connected to a gas supply source 14 via a flow rate controller 12 and the valve 13. The gas supply source 14 supplies a cleaning gas used for cleaning the inside of each processing chamber 11. When the valves 13 and 24 are controlled to be opened, the cleaning gas whose flow rate is controlled by the valve 13 is supplied to the branch unit 22 through the line 23. The cleaning gas is an example of a second gas.

The line 15, a valve 16, a flow rate controller 17, a valve 18, and a gas supply source 19 are connected to the buffer unit 30. The gas supply source 19 supplies a processing gas for processing a target object in each processing chamber 11. When the valve 16 and the valve 18 are controlled to be opened, the processing gas whose flow rate is controlled by the flow rate controller 17 is supplied to the branch unit 22 through the line 15 and the buffer unit 30. The processing gas is an example of a first gas.

The branch unit 22 distributes the processing gas supplied from the gas supply source 19 to a plurality of supply lines 21.

Figure 2:
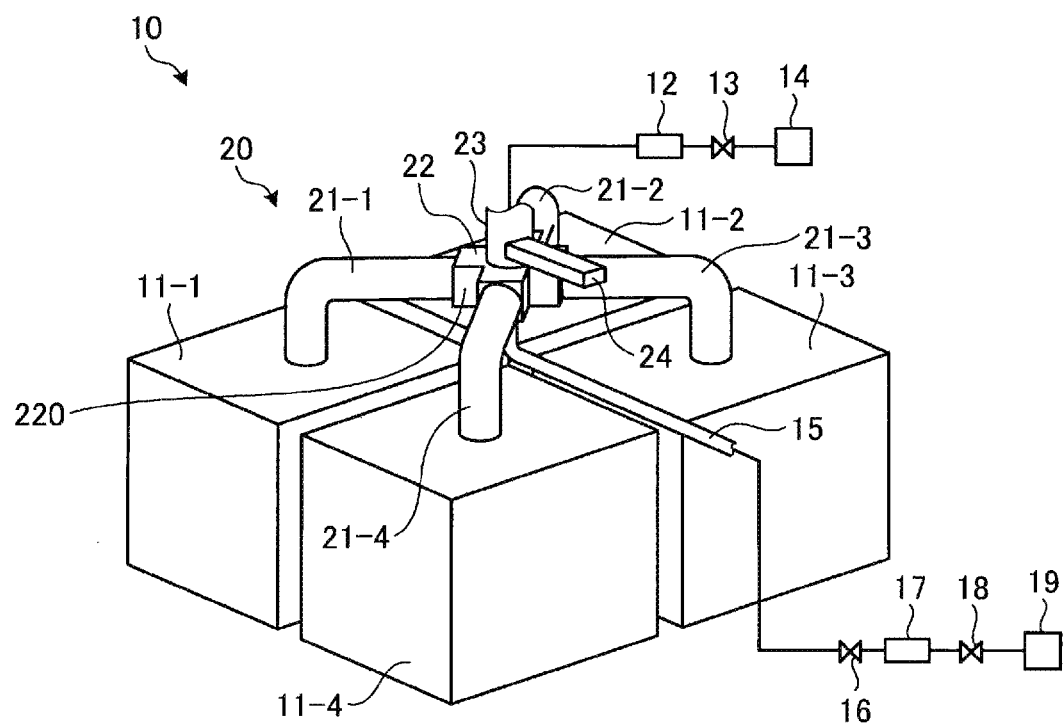
FIG. 2 shows an example of a processing apparatus in the vicinity of a branch unit.

FIG. 2 shows an example of the processing apparatus 10 in the vicinity of the branch unit 22. As shown in FIG. 2, for example, the processing chambers 11 are arranged in a horizontal direction. The branch unit 22 has a plurality of branch lines 220. In the present embodiment, the branch unit 22 has four branch lines 220.

The supply lines 21 have the same length and connect the processing chambers 11 and the branch unit 22. Specifically, the first end of the supply line 21-1 is connected to the processing chamber 11-1, and the second end of the supply line 21-1 is connected to one of the branch lines 220. The first end of the supply line 21-2 is connected to the processing chamber 11-2, and the second end of the supply line 21-2 is connected to another branch line 220. The first end of the supply line 21-3 is connected to the processing chamber 11-3, and the second end of the supply line 21-3 is connected to still another branch line 220. The first end of the supply line 21-4 is connected to the processing chamber 11-4, and the second end of the supply line 21-4 is connected to further still another branch line 220.

In the present embodiment, the line 23 is connected to substantially the central portion of the upper portion of the branch unit 22 via the valve 24, and the line 15 is connected to substantially the central portion of the lower portion of the branch unit 22 via the buffer unit 30. In another embodiment, the line 23 may be connected to the lower portion of the branch unit 22 via the valve 24, and the line 15 may be connected to the upper portion of the branch unit 22 via the buffer unit 30.

The line 23 is connected to the upper portion of the branch unit 22 to extend from the branch unit 22 in a first direction (e.g., vertically upward direction). When viewed in the first direction, each of the branch lines 220 radially extends in a direction (e.g., horizontal direction) intersecting with the first direction about the central axis of the line 23 at the connection position with the branch unit 22. When viewed in the first direction, each of the branch lines 220 radially extends in the horizontal direction so that the angles formed by two adjacent branch lines 220 become substantially equal to each other. In the present embodiment, the branch unit 22 has four branch lines 220, and the angle formed by two adjacent branch lines 220 is 90°. One branch line 220 is connected to one supply line 21. The line 15 is connected to the lower part of the branch unit 22 via the buffer unit 30.

When the valves 13 and 24 are controlled to be opened, the cleaning gas from the gas supply source 14 is supplied into the branch unit 22 in a direction opposite to the first direction through the line 23. The cleaning gas supplied into the branch unit 22 is distributed to the branch lines 220 by the branch unit 22 and supplied to the processing chambers 11 via the supply lines 21 connected to the branch lines 220.

When the valve 24 is controlled to be closed and the valves 16 and 18 are controlled to be opened, the processing gas from the gas supply source 19 is supplied to the buffer unit 30 through the line 15. The processing gas supplied to the buffer unit 30 is supplied into the branch unit 22 in the first direction. Then, the processing gas supplied into the branch unit 22 is distributed into the branch lines 220 by the branch unit 22 and supplied to the processing chambers 11 via the supply lines 21 connected to the branch lines 220.

While the cleaning gas is being supplied to the branch unit 22 through the line 23, the processing gas may be supplied at a small flow rate to the branch unit 22 through the line 15 and the buffer unit 30. Accordingly, it is possible to prevent the cleaning gas from flowing into the buffer unit 30 and the line 15.

Configuration of the Buffer Unit 30

Figure 3:
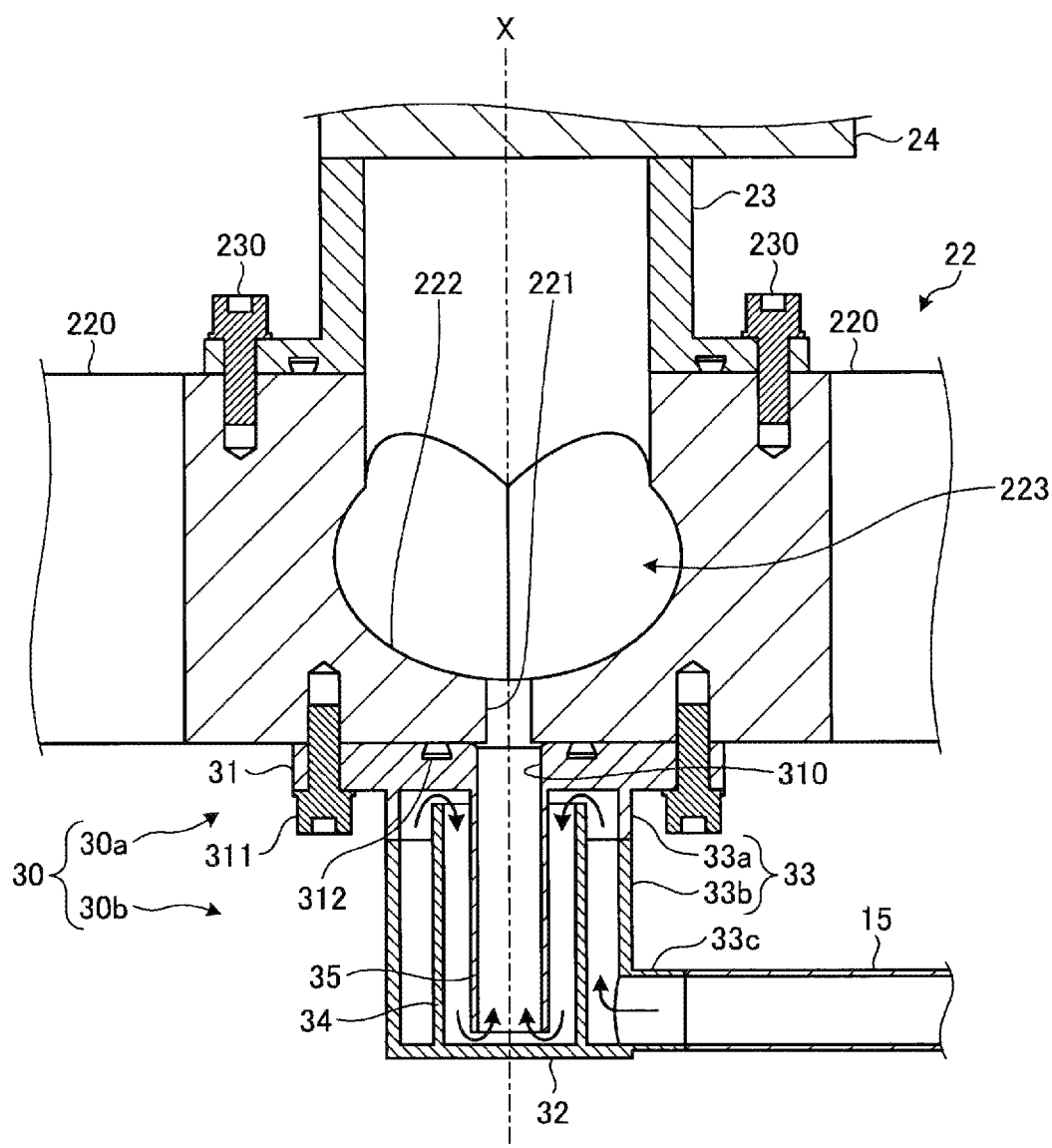
FIG. 3 is a cross sectional view showing an example of the branch unit and an example of a buffer unit.
Figure 4:
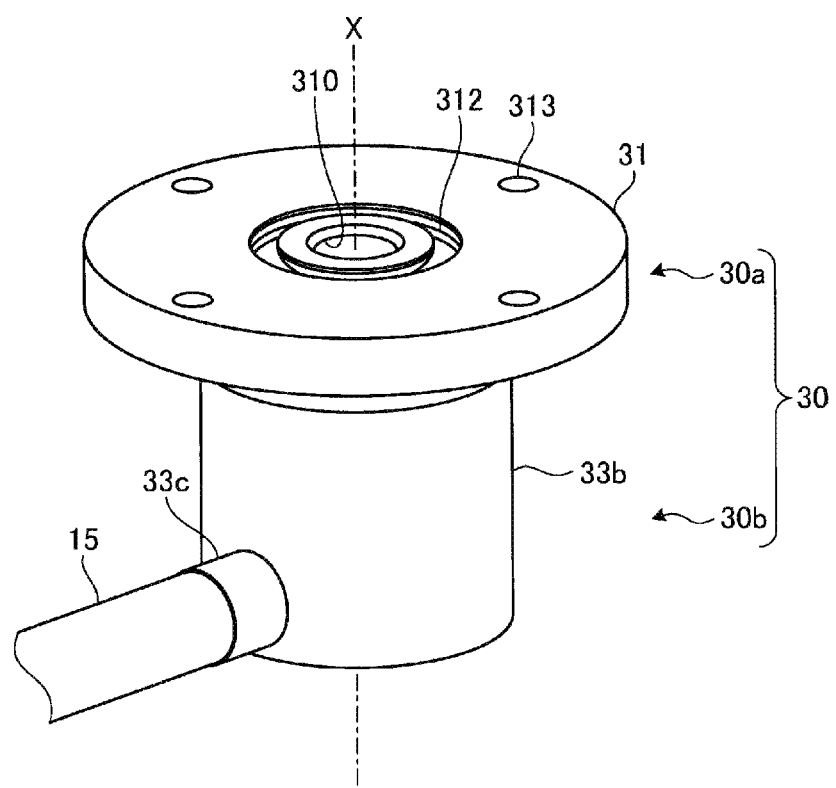
FIG. 4 is a perspective view showing an example of the buffer unit.
Figure 5:
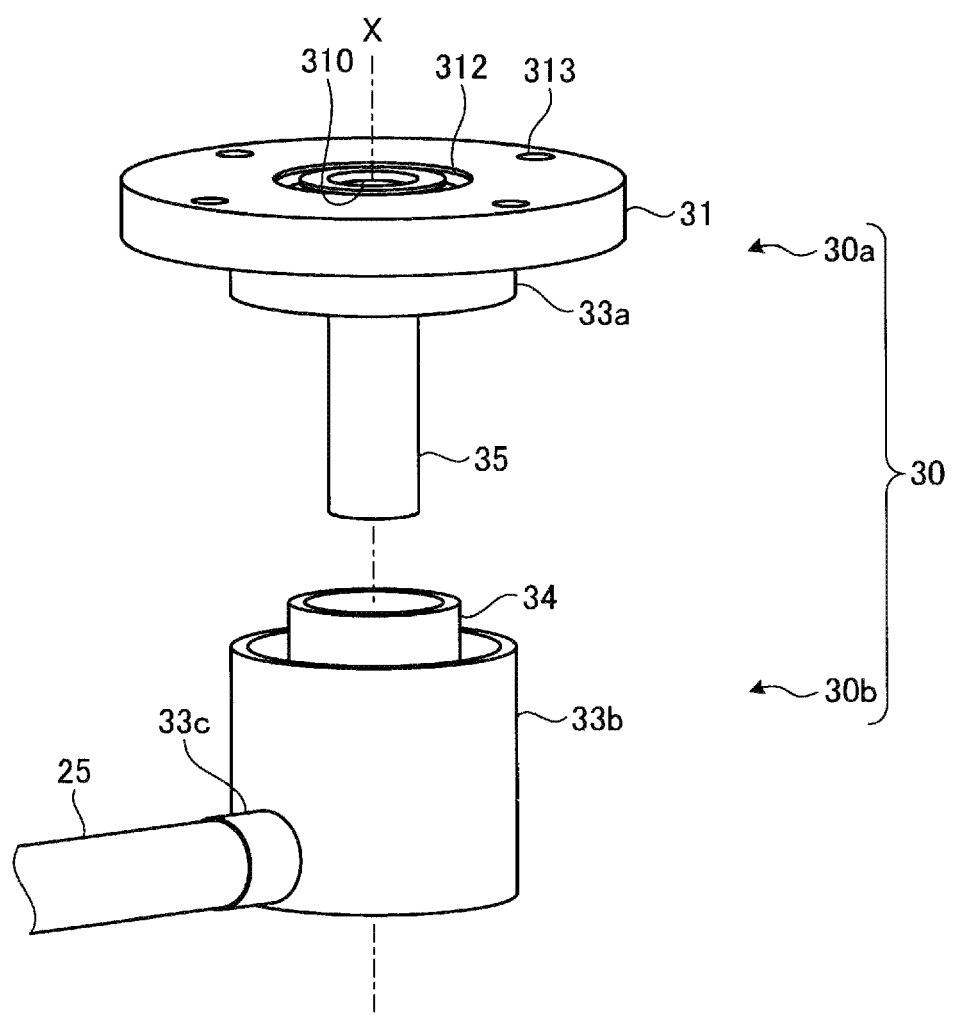
FIG. 5 is an exploded perspective view showing an exemplary structure of the buffer unit.
Figure 6:
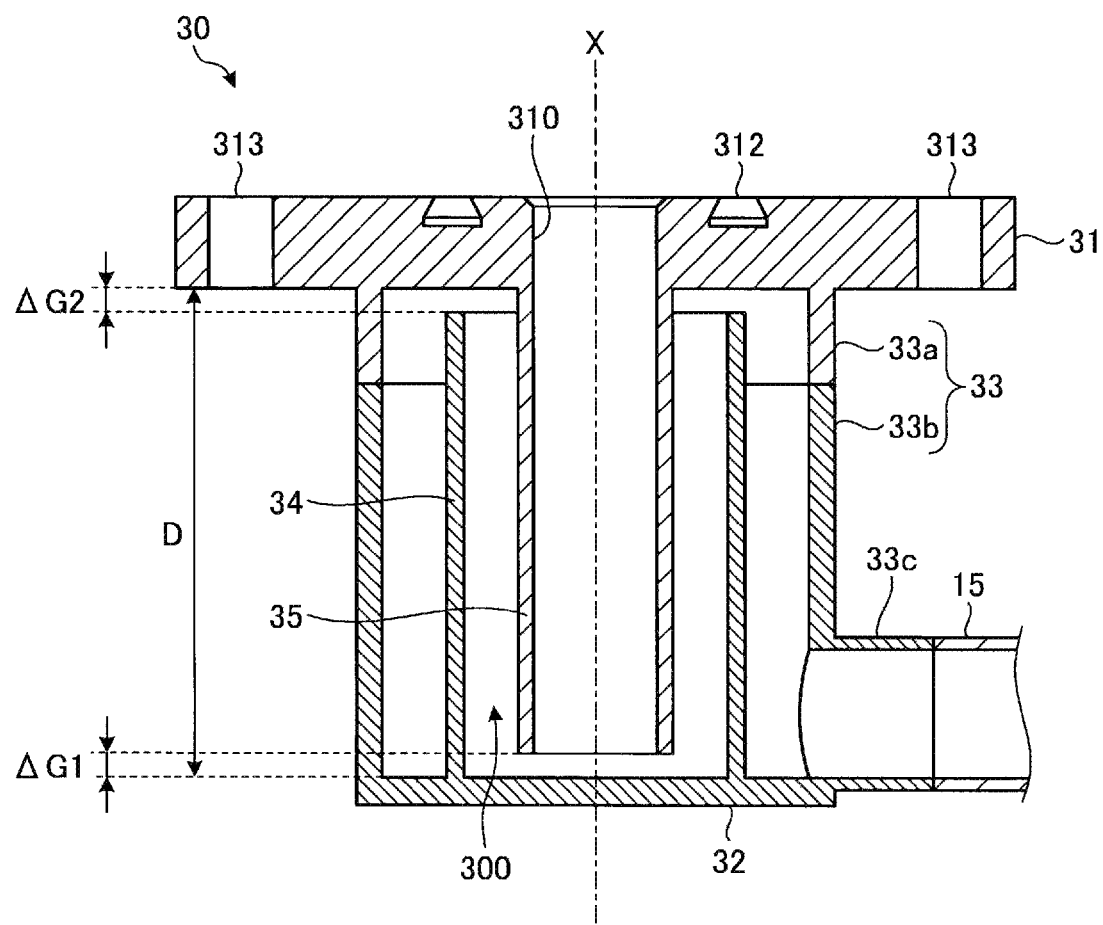
FIG. 6 is an enlarged cross sectional view showing an example of the buffer unit.

FIG. 3 is a cross sectional view showing an example of the branch unit 22 and the buffer unit 30. FIG. 4 is a perspective view showing an example of the buffer unit 30. FIG. 5 is an exploded perspective view showing an exemplary structure of the buffer unit 30. FIG. 6 is an enlarged cross sectional view showing an example of the buffer unit 30. The line 23 is arranged substantially at the central portion of the upper surface of the branch unit 22 and is fixed to the branch unit 22 by screws 230. The central axis of the line 23 at the connecting portion with the branch unit 22 is defined as the axis X. The buffer unit 30 is disposed substantially at the central portion of the bottom surface of the branch unit 22 and is fixed to the branch unit 22 by screws 311. In other words, the line 23 is connected to the surface of the branch unit 22 which is opposite to the surface to which the buffer unit 30 is connected. The buffer unit 30 is an example of a variation suppression unit.

The buffer unit 30 includes an upper wall 31, a lower wall 32, and a sidewall 33. As shown in FIG. 5, for example, the buffer unit 30 can be divided into a first casing 30a and a second casing 30b. The first casing 30a includes the upper wall 31, a sidewall 33a, and a partition wall 35. A groove 312 where a sealing member is disposed and screw holes 313 for fixing the buffer unit 30 to the branch unit 22 by the screws 311 are formed on the upper surface of the upper wall 31. The second casing 30b includes the lower wall 32, a sidewall 33b, and a partition wall 34. An opening 33c is formed at the lower portion of the sidewall 33b. The line 15 is connected to the opening 33c of the sidewall 33.

The sidewall 33 has a cylindrical shape and defines a side surface of a cylindrical space formed in the buffer unit 30. The upper wall 31 defines the upper surface of the cylindrical space formed by the sidewall 33. The lower wall 32 defines the bottom surface of the cylindrical space formed by the sidewall 33. A circular opening 310 is formed at the upper wall 31. In the present embodiment, the central axis of the opening 310 coincides with the axis X. The inner space 300 in the buffer unit 30 communicates with the inner space 223 formed by an inner wall 222 in the branch unit 22 through the opening 310 and an opening 221 of the branch unit 22. The upper wall 31 is an example of a first wall, and the lower wall 32 is an example of a second wall.

As shown in FIGS. 3 and 6, for example, the partition walls 34 and 35 are provided in the cylindrical inner space 300 formed by the sidewall 33. The partition wall 34 is provided at the lower wall 32, and the partition wall 35 is provided at the upper wall 31. The partition walls 34 and 35 have a coaxial hollow cylindrical shape. In the present embodiment, the central axes of the cylindrical partition walls 34 and 35 coincide with the axis X. Further, in the present embodiment, the diameter of the cylindrical partition wall 35 is smaller than that of the cylindrical partition wall 34. The partition wall 35 is an example of a first partition wall, and the partition wall 34 is an example of a second partition wall.

In the present embodiment, the inner diameter of the sidewall 33 is, e.g., 35 mm, and the inner diameter of the partition wall 34 is, e.g., 20 mm. The inner diameter of the partition wall 35 and the diameter of the opening 310 are, e.g., 10 mm. The inner diameters of the opening 33c and the line 15 are, e.g., 10 mm. The distance D between the upper wall 31 and the lower wall 32 is, e.g., 40 mm.

As shown in FIG. 6, for example, in the axis X direction, a gap ΔG1 is formed between the lower wall 32 and the partition wall 35, and a gap ΔG2 is formed between the upper wall 31 and the partition wall 34. The sizes of the gap ΔG1 and the gap ΔG2 are, e.g., 8 mm. The gap ΔG1 is an example of a first gap, and the gap ΔG2 is an example of a second gap.

As indicated by arrows in FIG. 3, for example, the processing gas supplied from the line 15 to the inner space 300 of the buffer unit 30 through the opening 33c flows upward in the space between the inner peripheral surface of the sidewall 33 and the outer peripheral surface of the partition wall 34 while being diffused in a circumferential direction about the axis X. As indicated by the arrows in FIG. 3, the processing gas that has reached the bottom surface of the upper wall 31 flows downward in the space between the inner peripheral surface of the partition wall 34 and the outer peripheral surface of the partition wall 35 through the gap ΔG2 while being diffused in the circumferential direction about the axis X. As indicated by the arrows in FIG. 3, for example, the processing gas that has reached the upper surface of the lower wall 32 flows into the space formed by the inner peripheral surface of the partition wall 35 through the gap ΔG1. The processing gas flowing into the space in the partition wall 35 flows upward while being diffused in the circumferential direction about the axis X and is supplied to the inner space 223 of the branch unit 22 through the openings 310 and 221.

COMPARATIVE EXAMPLE 1

Figure 7:
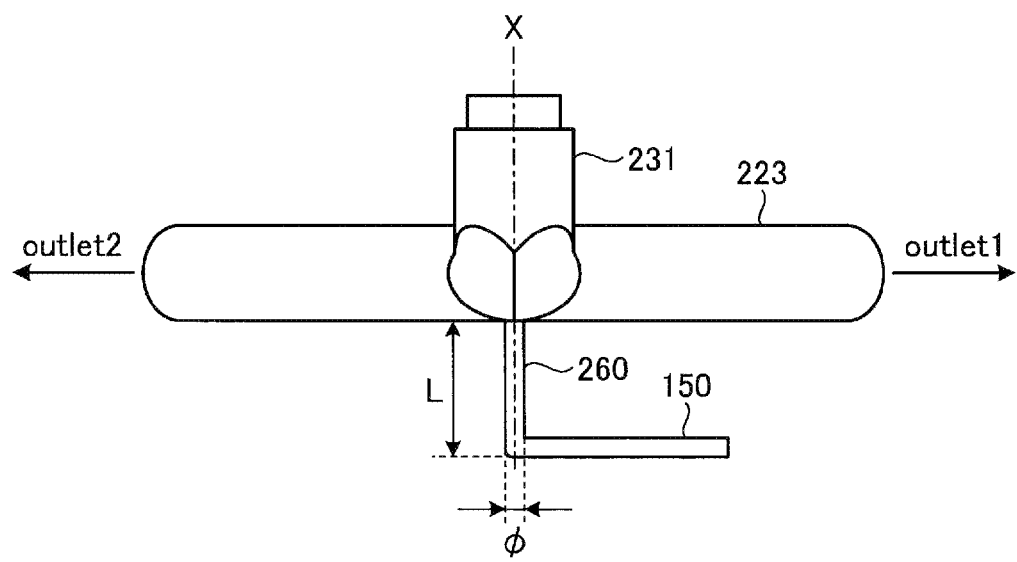
FIG. 7 shows an example of a gas supply method in a comparative example 1.

Here, the result of the simulation on the processing gas supply method will be described. FIG. 7 shows an example of the gas supply method in the comparative example 1. In the comparative example 1, the buffer unit 30 is not used, and the processing gas supplied from the line 15 is supplied to the branch unit 22 through a line extending linearly along the axis X. The line that connects the branch unit 22 and the line 15 has an inner space 260 through which the processing gas flows, and the central axis of the line coincides with the axis X.

FIG. 7 shows a part of the inner space 231 of the line 23, the inner space 223 of the branch unit 22, the inner space 150 of the line 15, and the inner space 260 of the line that connects the branch unit 22 and the line 15. The valve 24 provided in the line 23 is closed. The length of the inner space 260 is defined as L, and the diameter of the inner space 260 is defined as φ. The flows of the gases in the inner spaces 223 of two adjacent branch lines 220 among the four branch lines 220 of the branch unit 22 are defined as outlet1 and outlet2, respectively.

In the following simulation, the processing gas is supplied from the line 15 under the following conditions for one processing chamber 11.
Ar/He/O$_2$/TEOS=500 sccm/1800 sccm/1000 sccm/1.5 g
Pressure: 24 Torr
Temperature of partition wall of line: 150° C.

In the present embodiment, four processing chambers 11 are used and, thus, the total flow rate of the processing gas supplied from the line 15 to the branch unit 22 is about 16000 sccm. TEOS is an abbreviation for tetraethoxysilane.

Figure 8:
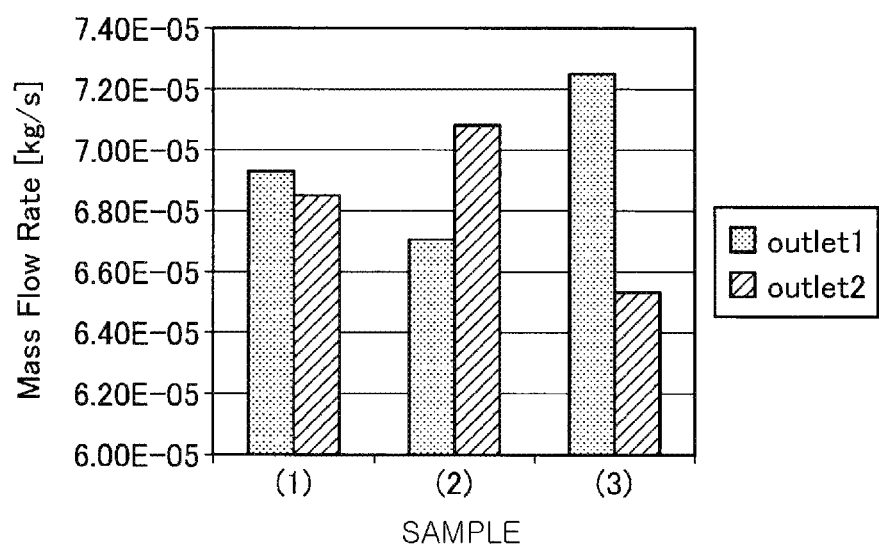
FIG. 8 shows an example of gas flow rate distribution of each sample in the comparative example 1.

FIG. 8 shows an example of gas flow rate distribution of each sample in the comparative example 1. In the sample (1), L is 53 mm and φ is 7.5 mm. In the sample (2), L is 30 mm and Φ is 7.5 mm. In the sample (3), L is 53 mm and φ is 10 mm.

As shown in FIG. 8, if the length L of the line is decreased, the difference between the flow rate of the gas of the outlet1 and the flow rate of the gas of the outlet2 is increased. When the diameter φ of the line is increased, the difference between the gas flow rate of the outlet1 and the flow rate of the gas of the outlet2 is increased. If a value obtained by dividing the difference between the maximum value and the minimum value by the average value is defined as an index d indicating the degree of variation, d was 1.1% in the sample (1), 5.5% in the sample (2), and 10.5% in the sample (3) according to the result shown in FIG. 8.

Figure 9:
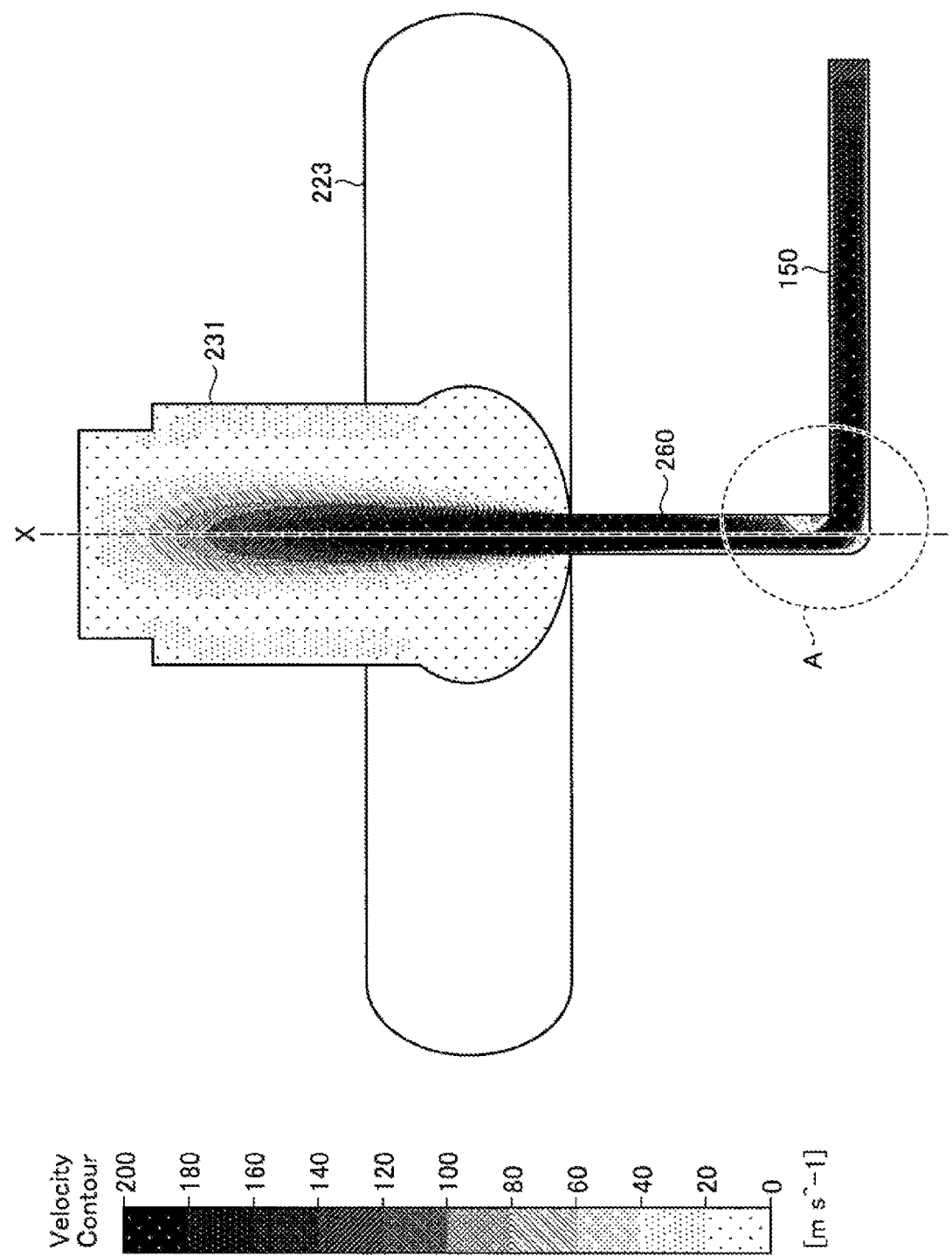
FIG. 9 shows an example of gas flow velocity distribution in the comparative example 1.

FIG. 9 shows an example of the gas flow velocity distribution in the sample (1) of the comparative example 1. FIG.

Figure 10:
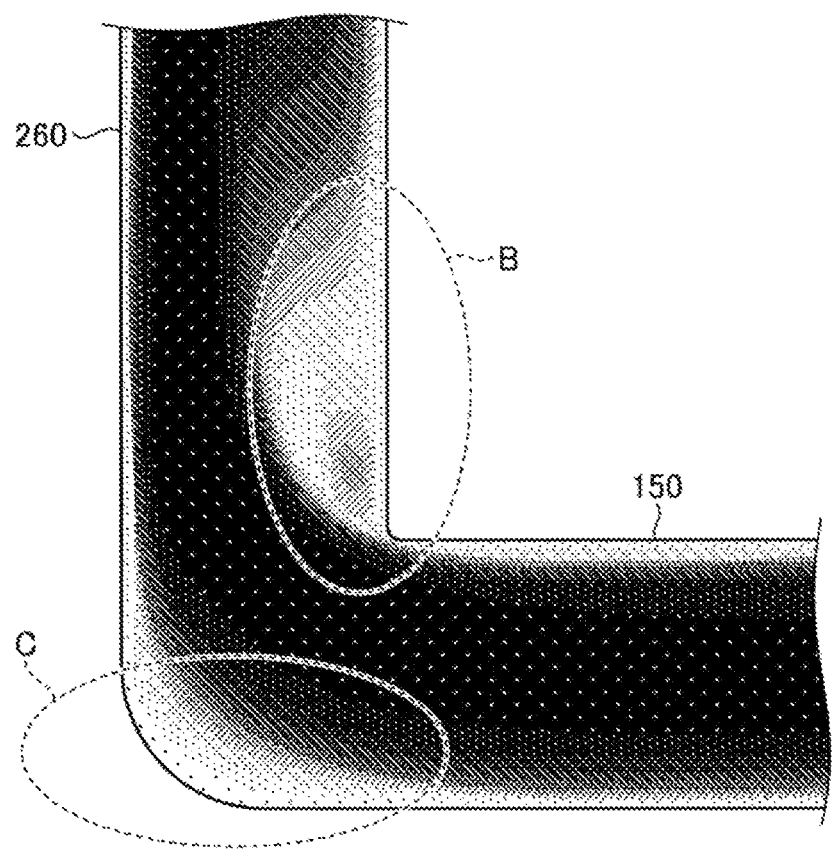
FIG. 10 is an enlarged view of a region A shown in FIG. 9.

10 is an enlarged view of a region A in FIG. 9. Referring to FIGS. 9 and 10, gas turbulence occurs in the regions B and C in the vicinity of the connecting portion between the inner space 150 of the line 15 and the inner space 260 of the line that connects the line 15 and the branch unit 22. Particularly, in the region B, separation of the gas flow occurs. Accordingly, the central axis of the flow velocity distribution of the gas supplied into the inner space 223 of the branch unit 22 from the line that connects the line 15 and the branch unit 22 is deviated from the axis X.

In the sample (2), the length L of the line is shorter than that of the sample (1) and, thus, the influence of the turbulence generated in the region A on the flow of the gas supplied into the branch unit 22 is increased. Accordingly, the difference in the flow rate of the gas of the outlet1 and the flow rate of the gas of the outlet2 is increased. In the sample (3), the diameter φ of the line is greater than that of the sample (1) and, thus, the distance between the central axis of the flow velocity distribution of the gas supplied into the inner space 223 and the axis X is further increased. Accordingly, the difference in the flow rate of the gas of the outlet1 and the flow rate of the gas of the outlet2 is increased.

Figure 11:
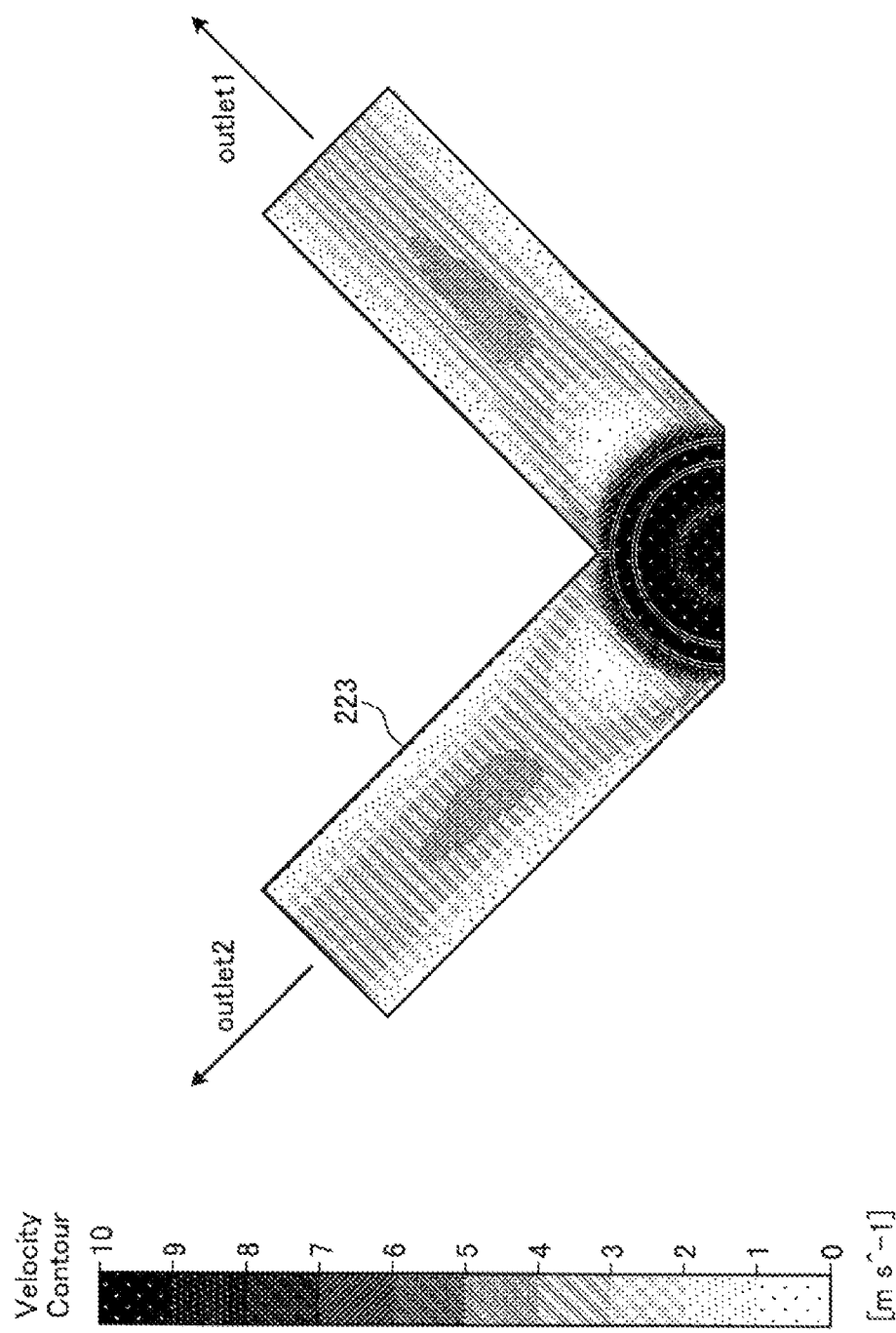
FIG. 11 shows an example of the gas flow velocity distribution in an inner space of the branch unit in the case of using a sample (1) of the comparative example 1.
Figure 12:
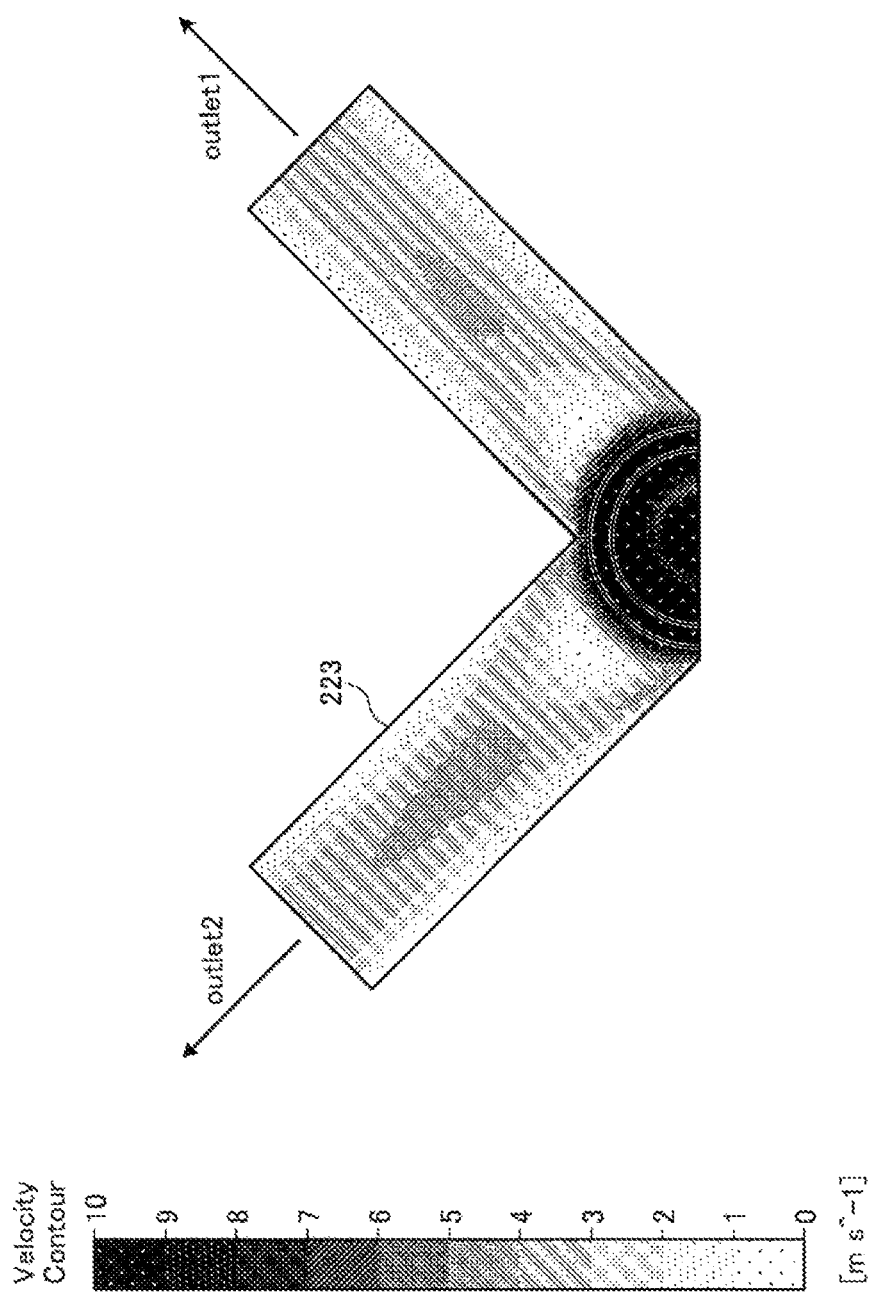
FIG. 12 shows an example of the gas flow velocity distribution in an inner space of the branch unit in the case of using a sample (2) of the comparative example 1.
Figure 13:
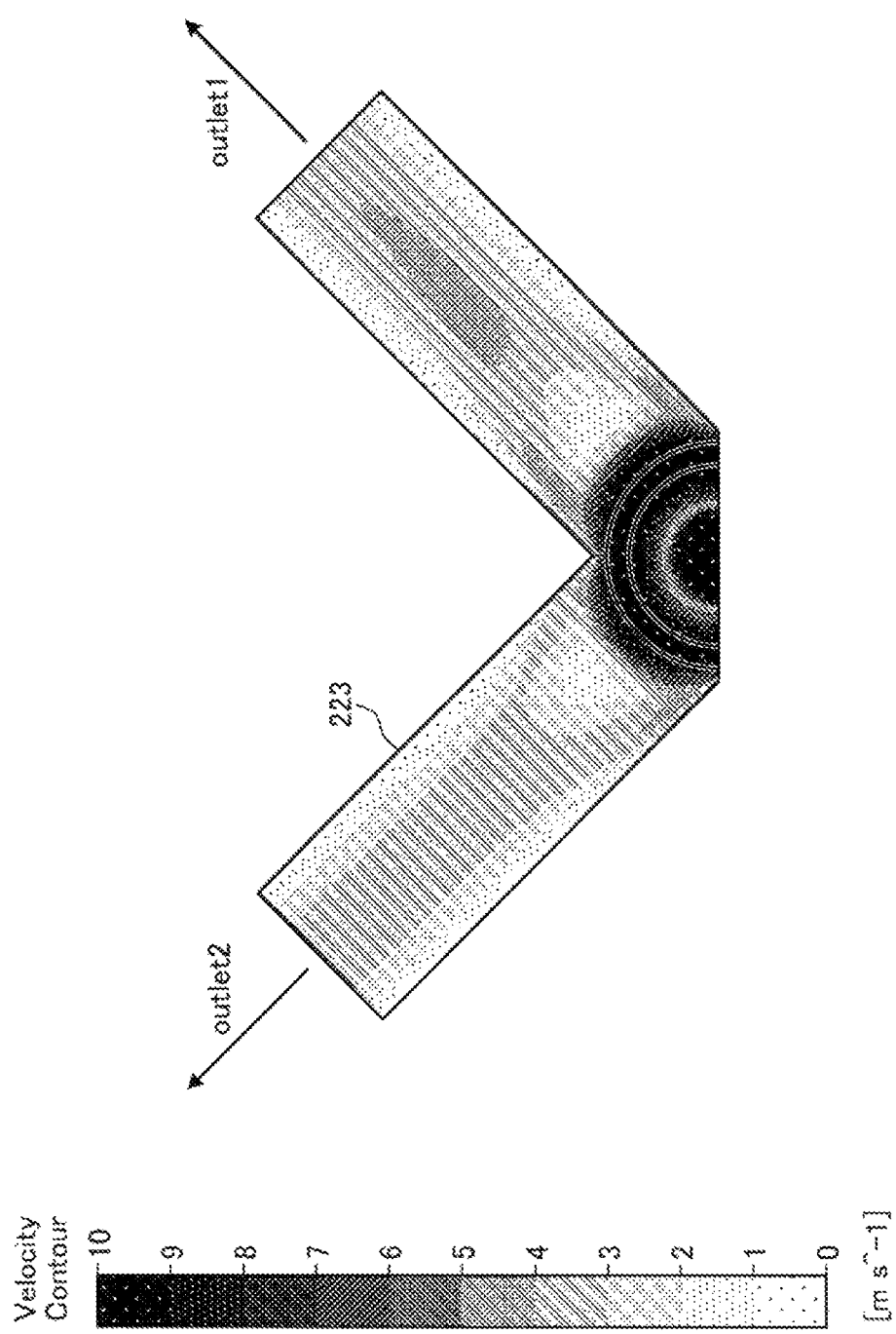
FIG. 13 shows an example of the gas flow velocity distribution in an inner space of the branch unit in the case of using a sample (3) of the comparative example 1.

FIG. 11 shows an example of the gas flow velocity distribution in the inner space 223 of the branch unit 22 in the case of using the sample (1) of the comparative example 1. FIG. 12 shows an example of the gas flow velocity distribution in the inner space 223 of the branch unit 22 in the case of using the sample (2) of the comparative example 1. FIG. 13 shows an example of the gas flow velocity distribution in the inner space 223 of the branch unit 22 in the case of using the sample (3) of the comparative example 1. Referring to FIGS. 11 and 12, as the length L of the line is decreased, the difference in the gas flow velocity distribution between the outlet1 and the outlet2 is increased. Further, referring to FIGS. 11 and 13, as the diameter φ of the line is increased, the difference in the gas flow velocity distribution between the outlet1 and the outlet2 is increased.

According to the results shown in FIGS. 8 to 13, in the line that connects the branch unit 22 and the line 15, the difference between the gas flow rate of the outlet1 and the gas flow rate of the outlet2 can be decreased by increasing L and decreasing φ. However, if the length L of the line extending linearly along the axis X is increased, the processing apparatus 10 is scaled up. If the inner diameter φ of the line is decreased, it is difficult to supply a gas at a high flow rate.

COMPARATIVE EXAMPLE 2

Figure 14:
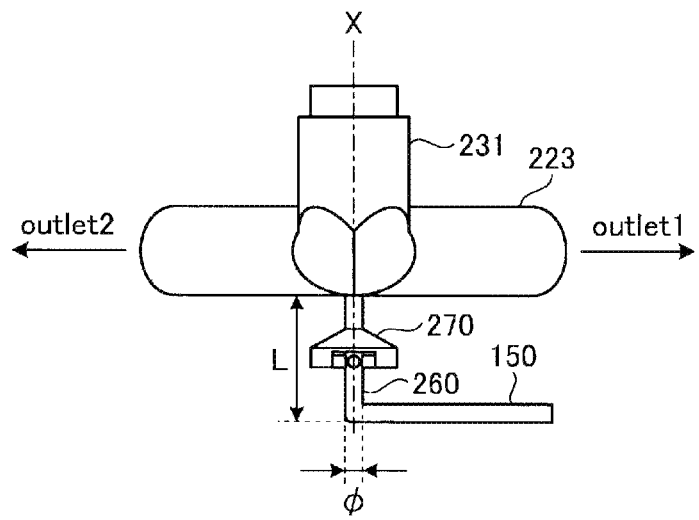
FIG. 14 shows an example of a gas supply method in a comparative example 2.

In the comparative example 2, a direction changing portion is provided in the line to suppress turbulence in the line that connects the line 15 and the branch unit 22. FIG. 14 shows an example of a gas supply method in a comparative example 2. In the direction changing portion, the direction of the gas flow in the line that connects the line 15 and the branch unit 22 is changed to a direction (e.g., horizontal direction) intersecting with the axis X, i.e., a direction in which the gas flows radially (e.g., four directions) about the axis X. Then, the gas flow of which direction is changed is directed to the axis X direction and the gas is supplied to the branch unit 22. In FIG. 14, the inner space 270 of the direction changing portion is illustrated. In the comparative example 2, L is 53 mm and φ is 7.5 mm.

Figure 15:
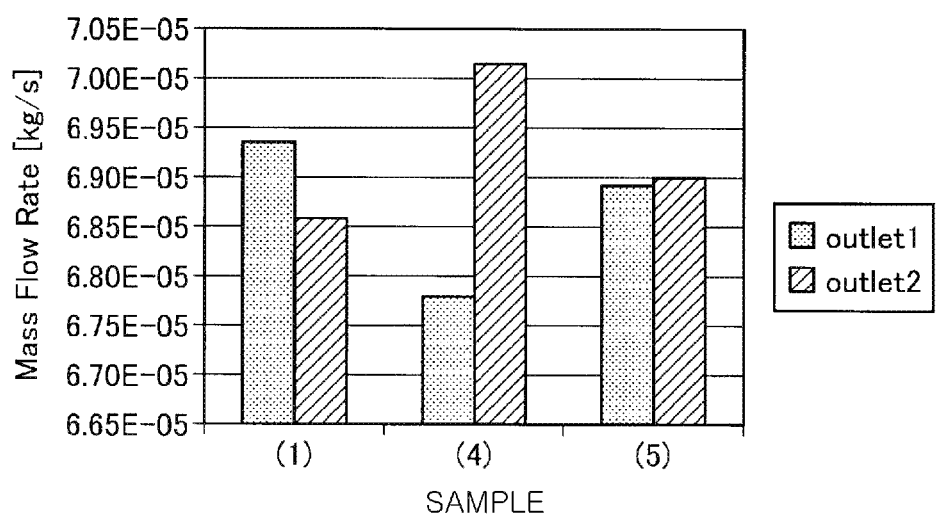
FIG. 15 shows an example of gas flow rate distribution in each sample.

FIG. 15 shows an example of the gas flow rate distribution in each sample. In FIG. 15, the sample (4) corresponds to the configuration of the comparative example 2 in which the direction changing portion is provided in the line. In FIG. 15, the sample (5) corresponds to the configuration of the present embodiment using the buffer unit 30 which has been described with reference to FIGS. 1 to 6. In the simulation, the gas was used under the same conditions as those in the simulation of FIG. 8.

If a value obtained by dividing the difference between the maximum value and the minimum value by the average value is defined as an index d indicating the degree of variation, d was 1.1% in the sample (1), 3.4% in the sample (4), and 0.1% in the sample according to the result of FIG. 15. From the result of FIG. 15, among the samples (1), (4) and (5), the degree of variation of the gas flow rate was lowest in the sample (5), i.e., the configuration of the embodiment which uses the buffer unit 30 described with reference to FIGS. 1 to 6.

Flow Velocity Distribution

Figure 16:
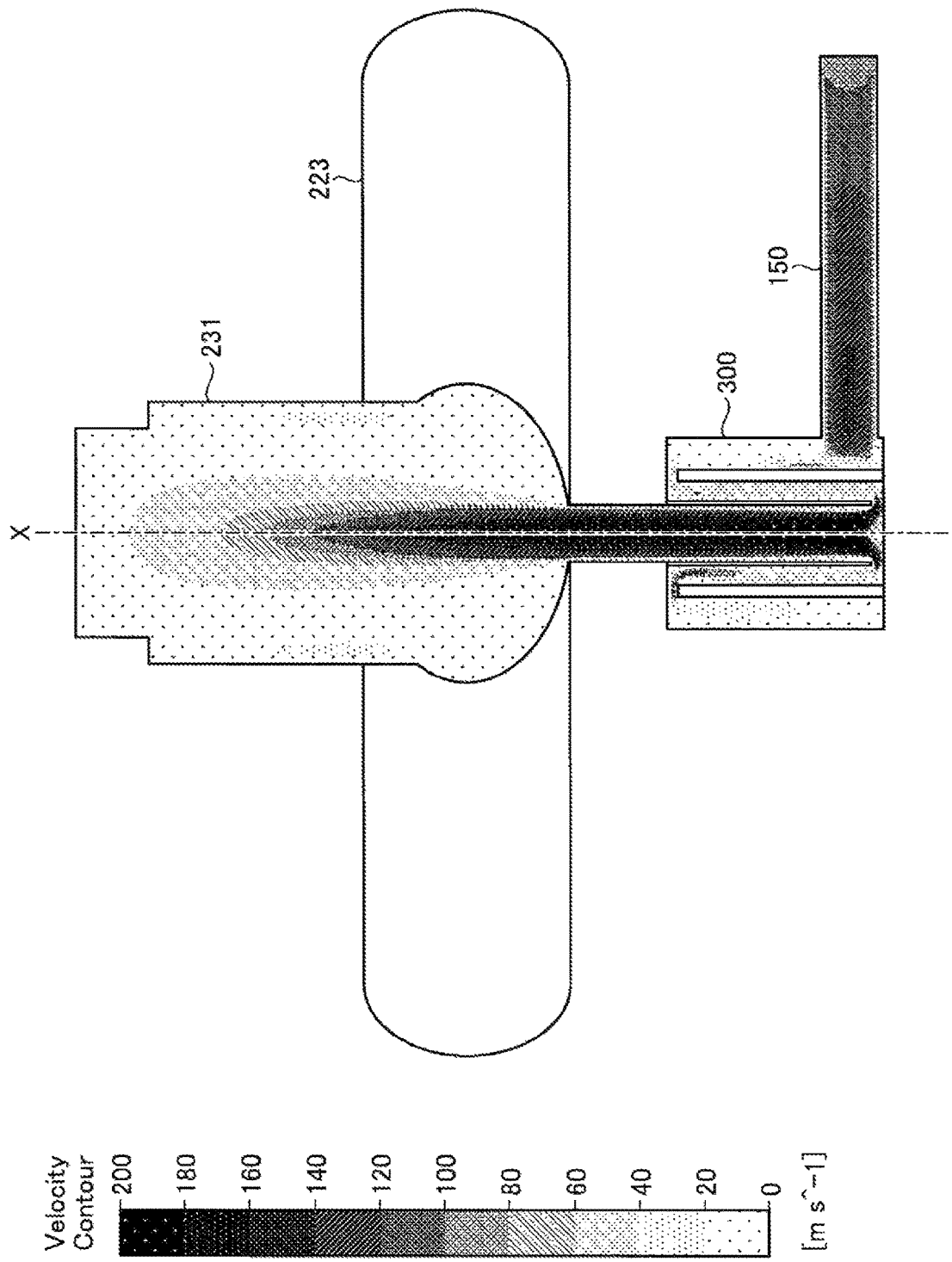
FIG. 16 shows an example of gas flow velocity distribution according to an embodiment.
Figure 17:
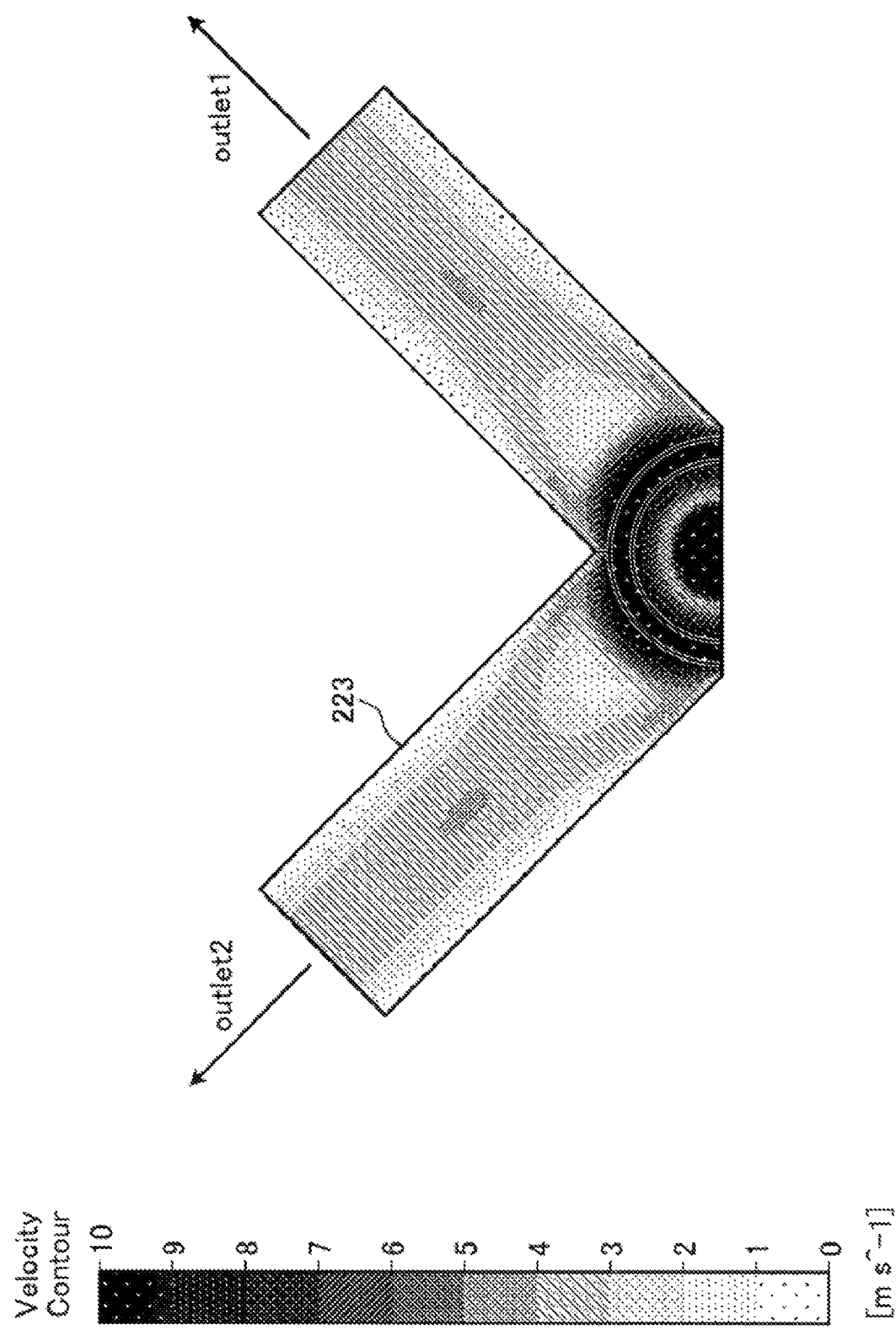
FIG. 17 shows the example of the gas flow velocity distribution according to the embodiment.

FIGS. 16 and 17 show an example of gas flow velocity distribution according to an embodiment of the present disclosure. FIG. 16 shows the flow velocity distribution of the gas flowing in a part of the inner space 231 of the line 23, the inner space 223 of the branch unit 22, the inner space 300 of the buffer unit 30, and the inner space 150 of the line 15. The valve 24 provided in the line 23 is closed. FIG. 17 shows the flow velocity distribution of the gas flowing in the inner space 223 of the branch unit 22.

As shown in FIG. 16, for example, in the inner space 300 of the buffer unit 30, the flow velocity distribution near the connecting portion between the buffer unit 30 and the line 15 is not uniform. However, as the gas flows in the vertical direction along the axis X in the inner space 300 while being diffused in the circumferential direction of the axis X, the variation of the flow velocity in the direction intersecting with the axis X is decreased. The variation of the flow velocity in the direction intersecting with the axis X is further decreased when the gas flows into the inner space 223 of the branch unit 22 from the inner space 300 of the buffer unit 30.

Referring to FIG. 17, the difference in the gas flow velocity distribution between the outlet1 and the outlet2 is considerably smaller than the difference in the gas flow velocity distribution in the comparative example 1 shown in FIGS. 11 to 13.

Figure 18:
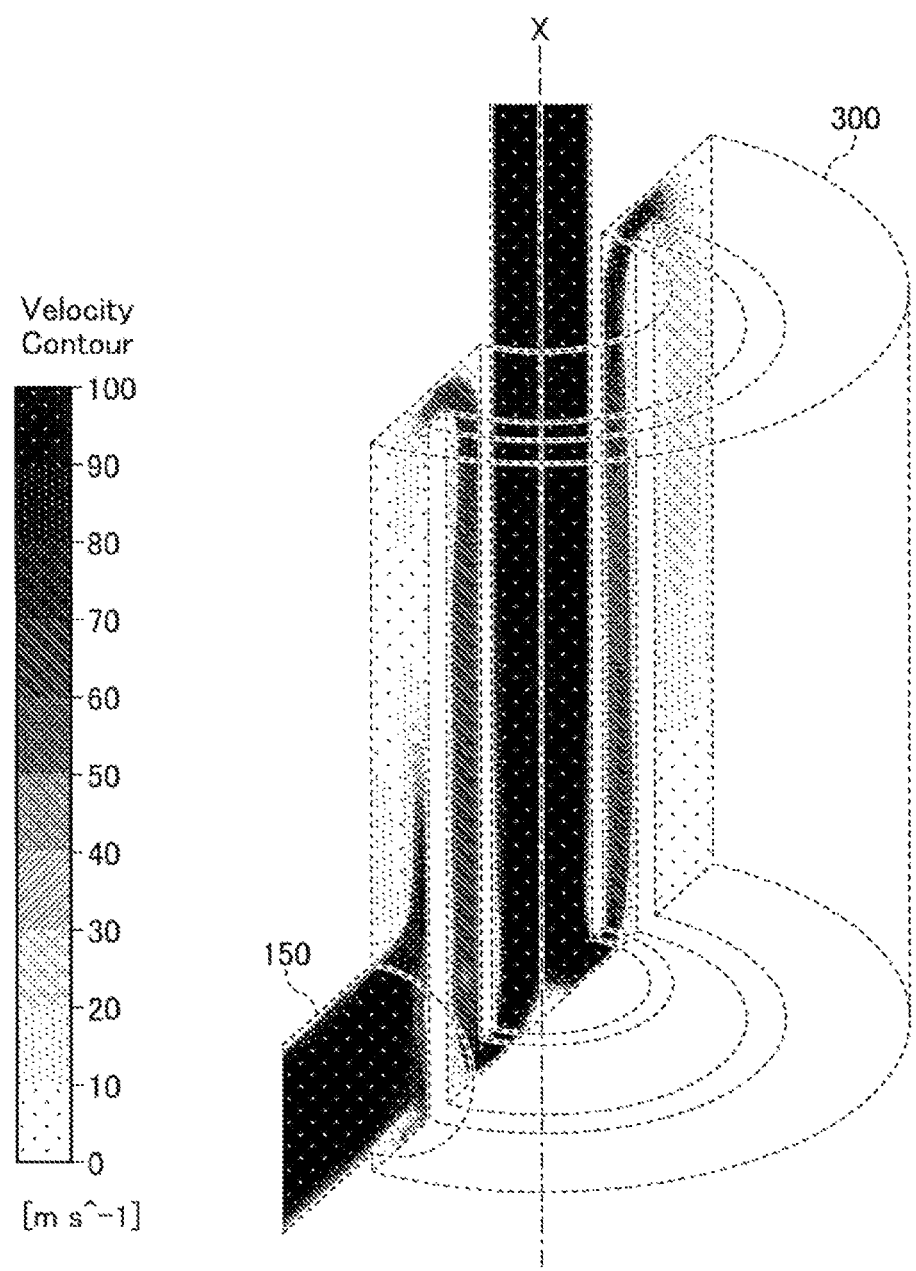
FIG. 18 shows an example of the gas flow velocity distribution in the inner space of the buffer unit according to an embodiment.
Figure 19:
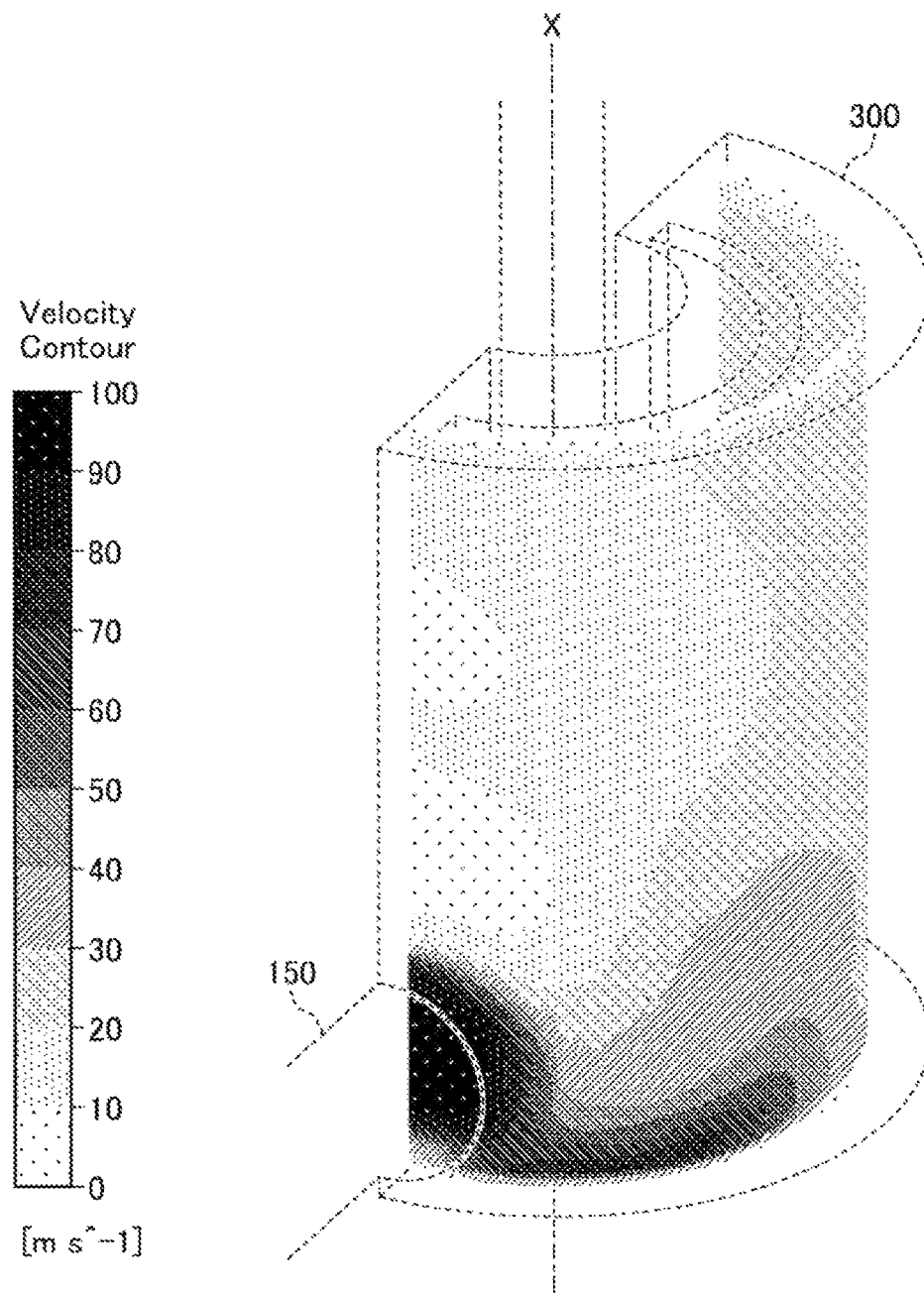
FIG. 19 shows an example of the gas flow velocity distribution in the inner space of the buffer unit according to the embodiment.
Figure 20:
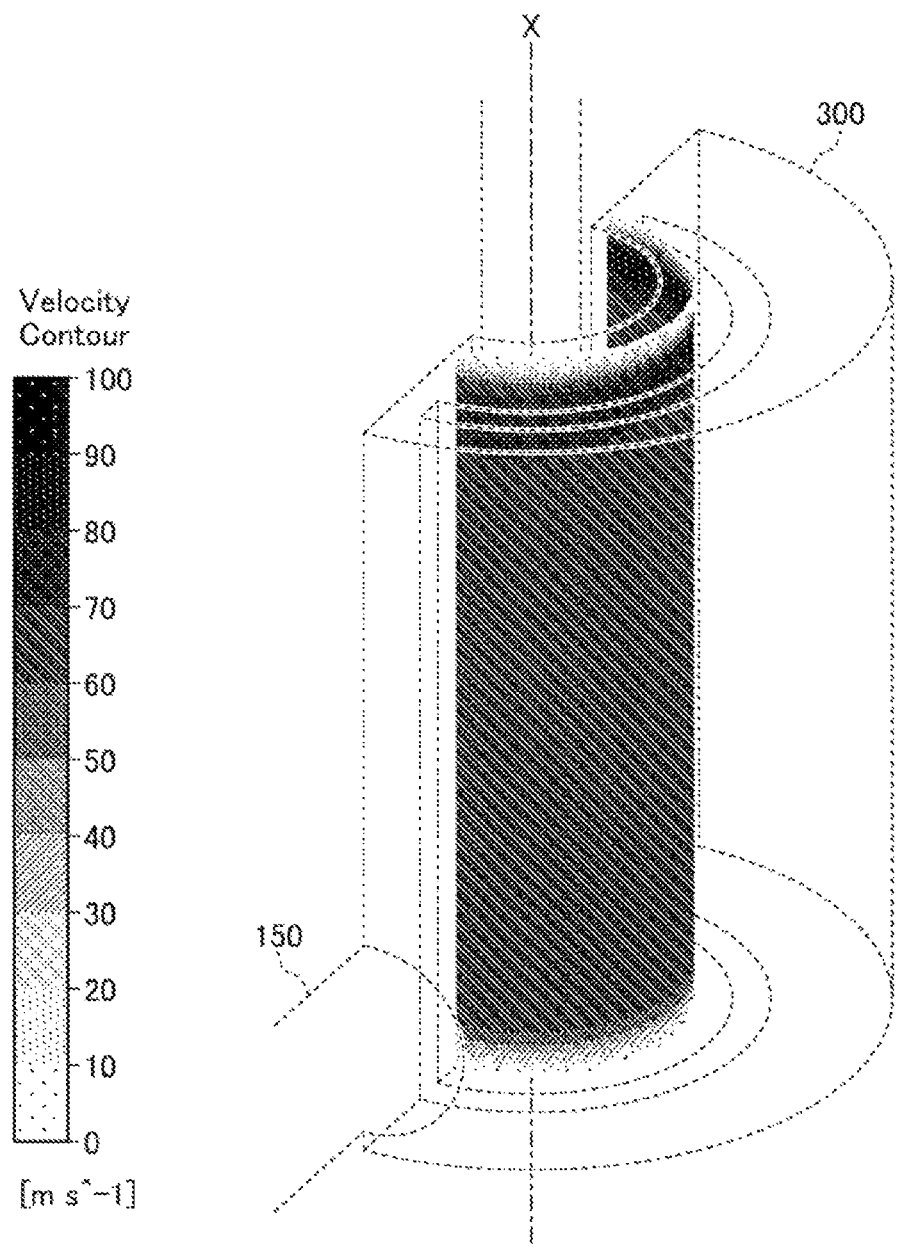
FIG. 20 shows an example of the gas flow velocity distribution in the inner space of the buffer unit according to the embodiment.
Figure 21:
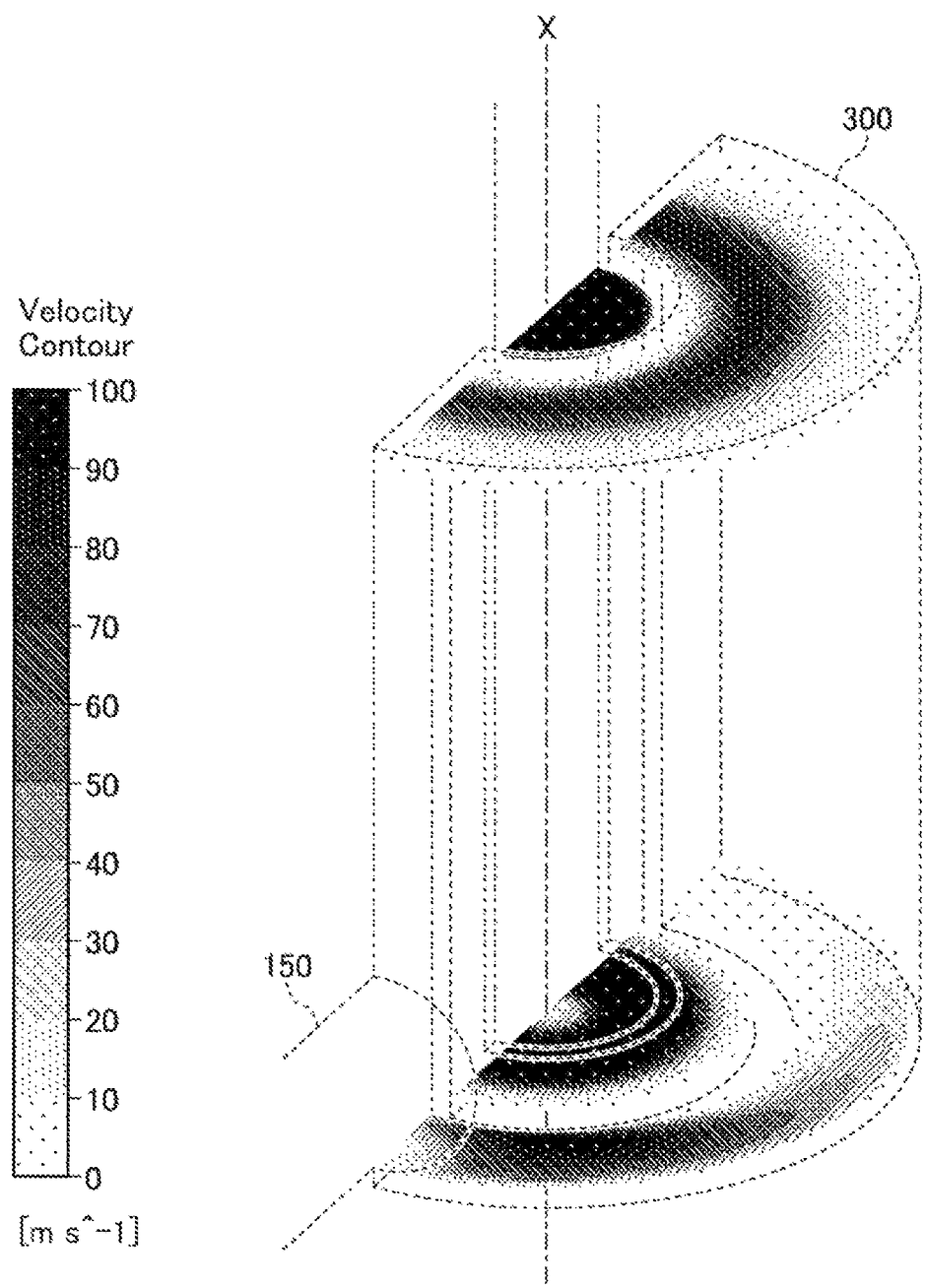
FIG. 21 shows an example of the gas flow velocity distribution in the inner space of the buffer unit according to the embodiment.

FIGS. 18 to 21 show an example of the gas flow velocity distribution in the inner space 300 of the buffer unit 30 according to the embodiment of the present disclosure. FIG. 18 shows an example of the gas flow velocity distribution on the plane passing through the axis X and the line 15. FIG. 19 shows an example of the gas flow velocity distribution in the cylindrical space between the sidewall 33 and the partition wall 34. FIG. 20 shows an example of the gas flow velocity distribution in the cylindrical space between the partition wall 34 and the partition wall 35. FIG. 21 shows an example of the gas flow velocity distribution in the vicinity of the bottom surface of the upper wall 31 and the vicinity of the upper surface of the lower wall 32.

For example, as shown in FIG. 18, the gas supplied to the inner space 300 of the buffer unit 30 through the inner space 150 of the line 15 collides with the outer peripheral surface of the partition wall 34 and diffuses along the outer peripheral surface of the partition wall 34. As the gas diffused along the outer peripheral surface of the partition wall 34 flows from the space between the sidewall 33 and the partition wall 34 to the space between the partition wall 34 and the partition wall 35, the variation of the flow velocity in the circumferential direction of the axis X is decreased. As the gas flowing into the space between the partition wall 34 and the partition wall 35 flows from the space between the partition wall 34 and the partition wall 35 into the space formed by the inner peripheral surface of the partition wall 35, the variation of the flow velocity in the circumferential direction of the axis X is further decreased. As shown in FIG. 18, for example, the variation of the flow velocity of the gas, in the circumferential direction of the axis X, flowing into the space formed by the inner peripheral surface of the partition wall 35 is considerably decreased.

The gas supplied to the inner space 300 of the buffer unit 30 through the inner space 150 of the line 15 collides with the outer peripheral surface of the partition wall 34 and diffuses along the outer peripheral surface of the partition wall 34, as shown in FIG. 19, for example. Referring to FIG. 19, the flow velocity of the gas that collides with the outer peripheral surface of the partition wall 34 through the inner space 150 of the line 15 becomes higher in the circumferential direction of the axis X than in the upward direction. In other words, the gas that collides with the outer peripheral surface of the partition wall 34 through the inner space 150 of the line 15 flows more in the circumferential direction of the axis X than in the upward direction. Accordingly, the gas flowing in the space between the sidewall 33 and the partition wall 34 diffuses in the circumferential direction of the axis X, and the variation of the flow velocity in the circumferential direction of the axis X is suppressed.

As shown in FIG. 20, for example, the gas flowing into the space between the partition wall 34 and the partition wall 35 from the space between the sidewall 33 and the partition wall 34 flows downward while being diffused in the circumferential direction of the axis X in the space between the partition wall 34 and the partition wall 35. Therefore, in the space between the partition wall 34 and the partition wall 35, the variation of the flow velocity of the gas in the circumferential direction of the axis X is smaller in the lower part than in the upper part.

As shown in FIG. 21, for example, in the lower part of the space between the sidewall 33 and the partition wall 34, the flow velocity is higher near the inner space 150 of the line 15. However, in the upper part of the space between the sidewall 33 and the partition wall 34, the variation of the gas flow velocity in the circumferential direction of the axis X is smaller than that in the lower part of the space between the sidewall 33 and the partition wall 34. In the lower part of the space between the partition wall 34 and the partition wall 35, the variation of the gas flow velocity in the circumferential direction of the axis X is further smaller than that in the upper part of the space between the partition wall 34 and the partition wall 35. The variation of the flow velocity of the gas flowing near the opening 310 of the upper wall 31 is considerably small in the circumferential direction of the axis X.

In this manner, the buffer unit 30 of the present embodiment generates a plurality of hollow cylindrical gas flows that is coaxial and has different radii. In the present embodiment, the central axes of the hollow cylindrical gas flows coincide with the axis X. The hollow cylindrical gas flows at least include a gas flow flowing toward the branch unit 22 while being diffused in the circumferential direction of the axes of the cylindrical gas flows and a gas flow flowing in a direction away from the branch unit 22 while being diffused in the circumferential direction of the axes of the cylindrical gas flows.

Therefore, the buffer unit 30 can increase the length of the flow path of the gas about the axis X, i.e., the flow path of the gas flowing along the axis X, compared to the case in which the line 15 and the branch unit 22 are connected by a line having a linear inner space 260. Accordingly, the gas flowing in the inner space 300 of the buffer unit 30 can be diffused in the circumferential direction of the axis X, which makes it possible to reduce the variation of the gas flow velocity in the circumferential direction of the axis X. As a result, the difference in the flow rates of the gases distributed to the branch lines 220 by the branch unit 22 can be reduced.

Gaps ΔG1 and ΔG2

Figure 22:
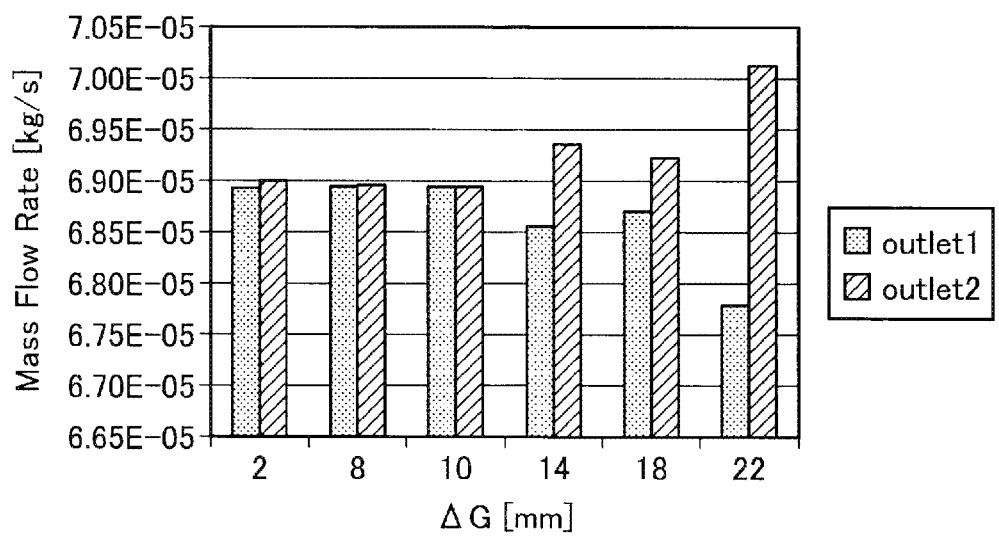
FIG. 22 shows an example of the relation between a size of a gap and the gas flow rate distribution.

FIG. 22 shows an example of the relation between the size of the gap and the distribution of the gas flow rate. In FIG. 22, the simulation was performed while setting the gap ΔG1 between the lower wall 32 and the partition wall 35 and the gap ΔG2 between the upper wall 31 and the partition wall 34 to the same size ΔG.

As shown in FIG. 22, when ΔG is 10 mm or less, the difference between the flow rate of gas of the outlet1 and the flow rate of gas of the outlet2 is small. However, when ΔG is 14 mm or more, the difference between the flow rate of gas of the outlet1 and the flow rate of gas of the outlet2 is increased. Therefore, ΔG is preferably 10 mm or less. ΔG is preferably greater than or equal to 1/20 and smaller than or equal to 1/4 of the distance D (see FIG. 6) between the bottom surface of the upper wall 31 and the upper surface of the lower wall 32, for example.

If ΔG is excessively small, the conductance of the space in the buffer unit 30 is decreased, which results in an increase in a gas switching time. Accordingly, in the processing apparatus 10 that performs the processing while switching processing gases, the improvement in the throughput of the processing may deteriorate. Therefore, ΔG is more preferably within a range of 2 mm or more and 10 mm or less. ΔG is more preferably greater than or equal to 1/20 and smaller than or equal to 1/4 of the distance between the bottom surface of the upper wall 31 and the upper surface of the lower wall 32, for example.

Relation Between Flow Rates of Processing Gas

Figure 23:
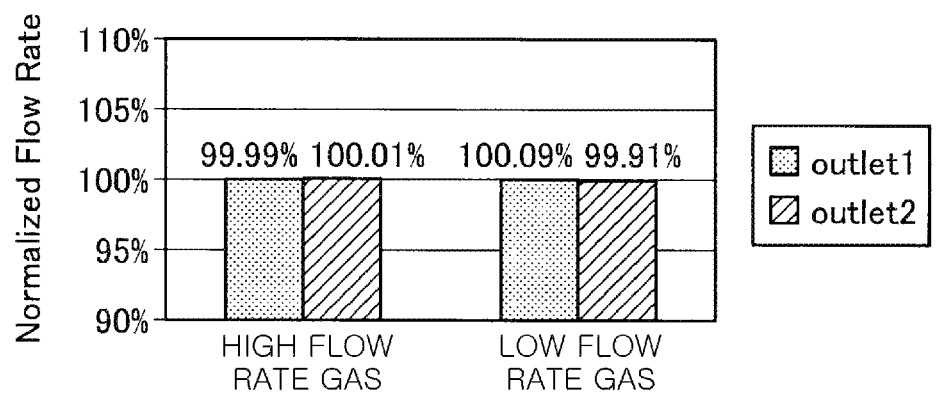
FIG. 23 shows an example of the relation between flow rates of supplied gases and flow rate distribution of distributed gases.

FIG. 23 shows an example of the relation between the flow rates of the supplied gases and the flow rate distribution of the distributed gases. In FIG. 23, there is shown the flow rates that are normalized on the assumption that the average of the flow rate of the gas of the outlet1 and the flow rate of the gas of the outlet2 is 100%. A high flow rate gas is a gas having a flow rate under the conditions used in FIGS. 8 and 15. A low flow rate gas is a gas supplied at the following flow rate per one processing chamber 11, for example.

$SiH_4/N_2$=60 sccm/100 sccm

In the present embodiment, four processing chambers 11 are used and, thus, the total flow rate of the low flow rate gas supplied to the branch unit 22 through the line 15 is 640 sccm.

As shown in FIG. 23, in the gas distribution device 20 of the present embodiment, the difference in the flow rate of the gas distributed to the branch lines 220 by the branch unit 22 is very small regardless of the high flow rate gas or the low flow rate gas.

Time for Switching Processing Gases

Figure 24:
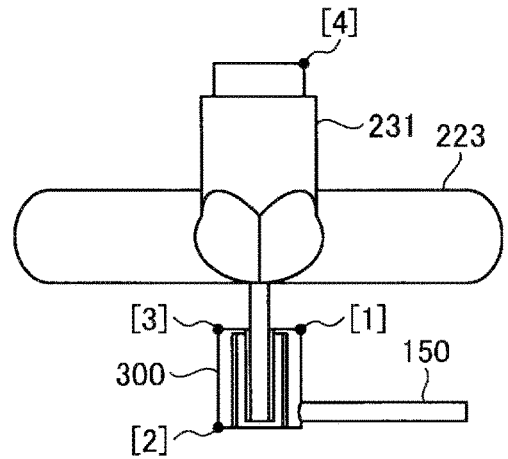
FIG. 24 shows an example of a measurement target space.

Next, the result of the simulation on the time for switching processing gases will be described. In the simulation, in a steady state in which a first test gas is supplied to a measurement target space, the gas supplied to the measurement target space was switched from a first test gas to a second test gas, and the changes in the component of the first test gas remaining in the measurement target space was measured. As shown in FIG. 24, for example, the measurement target space includes a part of the inner space 231 of the line 23, the inner space 223 of the branch unit 22, the inner space 300 of the buffer unit 30, and the inner space 150 of the line 15. FIG. 24 shows an example of the measurement target space. The valve 24 provided in the line 23 is closed.

The first test gas is a gas having a flow rate under the conditions used in FIGS. 8 and 15. The second test gas is a gas supplied at the following flow rate per one processing chamber 11.

Ar/He/$O_2$=500 sccm/1800 sccm/1000 sccm

The above flow rate represents the flow rate of the second test gas supplied per one processing chamber 11. In the present embodiment, four processing chambers 11 are used and, thus, the total flow rate of the second test gas supplied to the branch unit 22 through the line 15 is about 16000 sccm.

Figure 25:
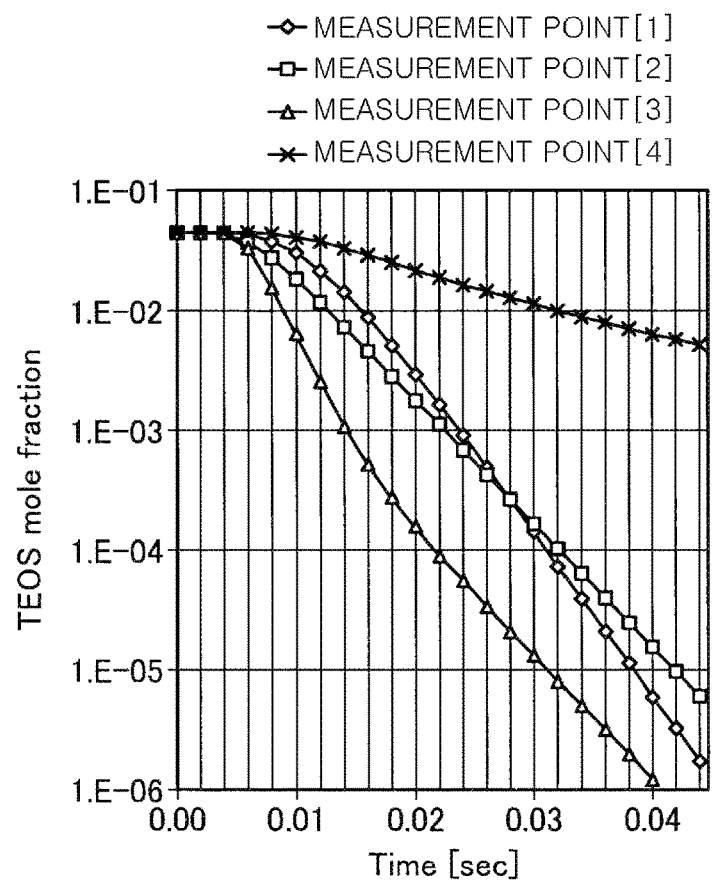
FIG. 25 shows exemplary changes in residual concentration of a gas component on measurement points.

FIG. 25 shows exemplary changes in the residual concentration of the component of the processing gas on measurement points. In FIG. 25, as for the residual concentration of the component of the processing gas, the mole fraction of TEOS remaining in the measurement target space was measured. The measurement points [1] to [4] shown in FIG. 25 correspond to the measurement points [1] to [4] shown in FIG. 24.

As shown in FIG. 25, for example, at the measurement points [1] to [3] in the inner space 300 of the buffer unit 30, the mole fraction of TEOS is diluted to ¹⁄₁₀₀₀ or less within about 40 msec after the first test gas is switched to the second test gas. Further, as shown in FIG. 25, for example, at the measurement point [4] in the inner space 231 of the line 23, the mole fraction of TEOS is diluted to about ¹⁄₁₀ within about 50 msec after the processing gas is switched. It is expected that the mole fraction of TEOS is diluted to about ¹⁄₁₀₀₀₀ at about 150 msec according to the decrease of the mole fraction of TEOS at the measurement point [4]. Since the switching time of the valve for switching gases is about several hundreds of msec, it is considered that the gas switching time is sufficiently short. Therefore, it is possible to suppress a decrease in the throughput of the processing even in the case of using the buffer unit 30 in the processing apparatus 10 that performs processing while switching a plurality of gases.

The embodiment of the processing apparatus 10 has been described above. In accordance with to the processing apparatus 10 of the present embodiment, it is possible to distribute the gas in a small space, and also possible to reduce the difference in the flow rates of the distributed gases.

Other Embodiments

The technique disclosed in the present disclosure is not limited to the above-described embodiments, and various modifications can be made within the scope of the gist of the present disclosure.

For example, in the above-described embodiments, one partition wall 34 and one partition wall 35 are provided in the buffer unit 30. However, the present disclosure is not limited thereto. For example, the partition wall 35 may be additionally disposed between the sidewall 33 and the partition wall 34. In that case, it is preferable to form the opening 33c at the upper portion (e.g., the sidewall 33a) of the sidewall 33.

In another embodiment, a plurality of partition walls 34 and a plurality of partition walls 35 may be provided in the buffer unit 30. In that case, one partition wall 35 is disposed at a position closest to the axis X, and the partition walls 34 and the partition walls 35 are arranged alternately as the distance from the axis X is increased. When the partition wall 34 is disposed at a position facing the inner peripheral surface of the sidewall 33, it is preferable to form the opening 33c at the lower part (e.g., the sidewall 33b) of the sidewall 33. When the partition wall 35 is disposed at a position facing the inner peripheral surface of the side wall 33, it is preferable to form the opening 33c at the upper portion (e.g., the sidewall 33a) of the sidewall 33.

In the above-described embodiments, the gas distribution device 20 distributes the gas to a plurality of processing chambers 11. However, the present disclosure is not limited thereto, and the gas may be distributed to one processing chamber 11. For example, the gas distribution device 20 of the above-described embodiment may be used as a mechanism for distributing a gas in the processing chamber 11 in which distributed gases are supplied into the processing space. Accordingly, the processing chamber 11 can be scaled down, and the uniformity of the gas in the processing space can be enhanced.

In the above-described embodiments, the gap ΔG1 between the lower wall 32 and the partition wall 35 and the gap ΔG2 between the upper wall 31 and the partition wall 34 have the same size (e.g., 8 mm). However, the present disclosure is not limited thereto. The gaps ΔG1 and ΔG2 may have different sizes as long as the sizes thereof are greater than or equal to ¹⁄₂₀ and smaller than or equal to ¼ of the distance D, for example.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

With respect to the above-described embodiments, the gas distribution device may be described as follows.

APPENDIX 1

A gas distribution device comprising:
a plurality of first supply lines respectively connected to a plurality of processing chambers;
a branch unit configured to distribute a first gas supplied from a first gas supply source to the first supply lines; and
a variation suppression unit provided between the branch unit and the first gas supply source and configured to supply the first gas from the first gas supply source to the branch unit and suppress variation in flow rates of the first gas distributed by the branch unit between the first supply lines.

APPENDIX 2

The gas distribution device described in Appendix 1, wherein the variation suppression unit generates a plurality of hollow cylindrical gas flows that is coaxial and has different radii, and
wherein the hollow cylindrical gas flows at least include a gas flow flowing toward the branch unit while being diffused in a circumferential direction of axes of the cylindrical gas flows and a gas flow flowing in a direction away from the branch unit while being diffused in the circumferential direction of the axes of the cylindrical gas flows.

APPENDIX 3

The gas distribution device described in Appendix 1 or 2, wherein the variation suppression unit includes:
a sidewall that defines a side surface of a cylindrical space formed in the variation suppression unit;
a first wall that defines an upper surface of the cylindrical space and has a circular opening which is coaxial with the cylindrical space;
a second wall that defines a bottom surface of the cylindrical space;
a first partition wall formed at the first wall in the cylindrical space, the first partition wall having a hollow cylindrical shape that is coaxial with the cylindrical space; and
a second partition wall formed at the second wall in the cylindrical space, the second partition wall having a hollow cylindrical shape that is coaxial with the cylindrical space and has an inner diameter different from an inner diameter of the first partition wall,
wherein a first gap is formed between the first partition wall and the second wall,
a second gap is formed between the second partition wall and the first wall,
an opening is formed at the sidewall, and
the first gas supplied from the first gas supply source is supplied into the cylindrical space of the variation suppression unit through the opening formed at the sidewall and is supplied to the branch unit through the opening formed at the first wall.

APPENDIX 4

The gas distribution device described in Appendix 3, wherein a diameter of the first partition wall is smaller than a diameter of the second partition wall.

APPENDIX 5

The gas distribution device described in Appendix 3 or 5, wherein a width of the first gap is greater than or equal to 1/20 and smaller than or equal to 1/4 of a distance between the first wall and the second wall.

APPENDIX 6

The gas distribution device described in any one of Appendices 3 to 5, wherein a width of the second gap is greater than or equal to 1/20 and smaller than or equal to 1/4 of a distance between the first wall and the second wall.

APPENDIX 7

The gas distribution device described in any one of Appendices 1 to 6, further comprising:
a second supply line configured to supply a second gas from a second gas supply source to the branch unit; and
a valve provided in the second supply line,
wherein when the valve is controlled to be opened, the branch unit distributes the second gas supplied through the second supply line to the first supply lines, and
the second supply line is connected to a surface of the branch unit which is opposite to a surface to which the variation suppression unit is connected.

APPENDIX 8

The gas distribution device described in Appendix 7, wherein the first gas is a gas for processing a target object in each of the processing chambers, and
the second gas is a gas for cleaning the inside of each of the processing chambers.

APPENDIX 9

A processing apparatus comprising:
a plurality of processing chambers;
a plurality of first supply lines respectively connected to the plurality of processing chambers;
a branch unit configured to distribute a first gas supplied from a first gas supply source to the first supply lines; and
a variation suppression unit provided between the branch unit and the first gas supply source and configured to supply the first gas from the first gas supply source to the branch unit and suppress variation in flow rates of the first gas distributed by the branch unit between the first supply lines.

While the present disclosure has been shown and described with respect to the embodiments, it will be understood by those skilled in the art that various changes and modifications may be made without departing from the scope of the present disclosure as defined in the following claims.

What is claimed is:
1. A gas distribution device comprising:
a plurality of first supply lines respectively connected to a plurality of processing chambers;
a branch unit configured to distribute a first gas supplied from a first gas supply source to the first supply lines; and
a variation suppression unit provided between the branch unit and the first gas supply source and configured to supply the first gas from the first gas supply source to the branch unit and suppress variation in flow rates of the first gas distributed by the branch unit between the first supply lines.
2. The gas distribution device of claim 1, wherein the variation suppression unit generates a plurality of hollow cylindrical gas flows that is coaxial and has different radii, and
wherein the hollow cylindrical gas flows at least include a gas flow flowing toward the branch unit while being diffused in a circumferential direction of axes of the cylindrical gas flows and a gas flow flowing in a direction away from the branch unit while being diffused in the circumferential direction of the axes of the cylindrical gas flows.
3. The gas distribution device of claim 1, wherein the variation suppression unit includes:
a sidewall that defines a side surface of a cylindrical space formed in the variation suppression unit;
a first wall that defines an upper surface of the cylindrical space and has a circular opening which is coaxial with the cylindrical space;
a second wall that defines a bottom surface of the cylindrical space;

a first partition wall formed at the first wall in the cylindrical space, the first partition wall having a hollow cylindrical shape that is coaxial with the cylindrical space; and a second partition wall formed at the second wall in the cylindrical space, the second partition wall having a hollow cylindrical shape that is coaxial with the cylindrical space and has an inner diameter different from an inner diameter of the first partition wall, wherein a first gap is formed between the first partition wall and the second wall, a second gap is formed between the second partition wall and the first wall, an opening is formed at the sidewall, and the first gas supplied from the first gas supply source is supplied into the cylindrical space of the variation suppression unit through the opening formed at the sidewall and is supplied to the branch unit through the opening formed at the first wall.

4. The gas distribution device of claim 3, wherein a diameter of the first partition wall is smaller than a diameter of the second partition wall.

5. The gas distribution device of claim 3, wherein a width of the first gap is greater than or equal to 1/20 and smaller than or equal to 1/4 of a distance between the first wall and the second wall.

6. The gas distribution device of claim 3, wherein a width of the second gap is greater than or equal to 1/20 and smaller than or equal to 1/4 of a distance between the first wall and the second wall.

7. The gas distribution device of claim 1, further comprising:

a second supply line configured to supply a second gas from a second gas supply source to the branch unit; and a valve provided in the second supply line, wherein when the valve is controlled to be opened, the branch unit distributes the second gas supplied through the second supply line to the first supply lines, and the second supply line is connected to a surface of the branch unit which is opposite to a surface to which the variation suppression unit is connected.

8. The gas distribution device of claim 7, wherein the first gas is a gas for processing a target object in each of the processing chambers, and the second gas is a gas for cleaning the inside of each of the processing chambers.

9. A processing apparatus comprising:

a plurality of processing chambers;

a plurality of first supply lines respectively connected to the plurality of processing chambers;

a branch unit configured to distribute a first gas supplied from a first gas supply source to the first supply lines; and a variation suppression unit provided between the branch unit and the first gas supply source and configured to supply the first gas from the first gas supply source to the branch unit and suppress variation in flow rates of the first gas distributed by the branch unit between the first supply lines.

\* \* \* \* \*